United States Patent
Liu

(10) Patent No.: US 11,152,277 B2
(45) Date of Patent: Oct. 19, 2021

(54) THREE-DIMENSIONAL MEMORY DEVICES HAVING HYDROGEN BLOCKING LAYER AND FABRICATION METHODS THEREOF

(71) Applicant: YANGTZE MEMORY TECHNOLOGIES CO., LTD., Wuhan (CN)

(72) Inventor: Jun Liu, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 16/727,870

(22) Filed: Dec. 26, 2019

(65) Prior Publication Data

US 2021/0111089 A1 Apr. 15, 2021

Related U.S. Application Data

(63) Continuation of application No. PCT/CN2019/110752, filed on Oct. 12, 2019.

(51) Int. Cl.
*H01L 27/1157* (2017.01)
*H01L 23/31* (2006.01)
(Continued)

(52) U.S. Cl.
CPC .......... *H01L 23/3192* (2013.01); *H01L 24/19* (2013.01); *H01L 24/20* (2013.01);
(Continued)

(58) Field of Classification Search
CPC ..... H01L 23/3192; H01L 24/19; H01L 24/20; H01L 24/27; H01L 24/29; H01L 24/82;
(Continued)

(56) References Cited

U.S. PATENT DOCUMENTS

2010/0224961 A1 9/2010 Summerfelt et al.
2017/0207244 A1 7/2017 Kato
(Continued)

FOREIGN PATENT DOCUMENTS

CN 103250251 A 8/2013
CN 109564923 A 4/2019
(Continued)

OTHER PUBLICATIONS

International Search Report issued in corresponding International Application No. PCT/CN2019/110752, dated Jul. 15, 2020, 5 pages.

*Primary Examiner* — Timor Karimy
(74) *Attorney, Agent, or Firm* — Bayes PLLC

(57) ABSTRACT

Embodiments of three-dimensional (3D) memory devices have a hydrogen blocking layer and fabrication methods thereof are disclosed. In an example, a 3D memory device includes a substrate, a memory stack including interleaved conductive layers and dielectric layers above the substrate, an array of NAND memory strings each extending vertically through the memory stack, a plurality of logic process-compatible devices above the array of NAND memory strings, a semiconductor layer above and in contact with the logic process-compatible devices, a pad-out interconnect layer above the semiconductor layer, and a hydrogen blocking layer vertically between the semiconductor layer and the pad-out interconnect layer and configured to block outgassing of hydrogen.

20 Claims, 11 Drawing Sheets

(51) Int. Cl.
  *H01L 25/065* (2006.01)
  *H01L 23/00* (2006.01)
  *H01L 27/11524* (2017.01)
  *H01L 27/11556* (2017.01)
  *H01L 27/11582* (2017.01)

(52) U.S. Cl.
  CPC .............. *H01L 24/27* (2013.01); *H01L 24/29* (2013.01); *H01L 24/82* (2013.01); *H01L 24/83* (2013.01); *H01L 25/0657* (2013.01); *H01L 27/1157* (2013.01); *H01L 27/11524* (2013.01); *H01L 27/11556* (2013.01); *H01L 27/11582* (2013.01)

(58) Field of Classification Search
  CPC ................. H01L 24/83; H01L 25/0657; H01L 27/11524; H01L 27/11556; H01L 27/1157; H01L 27/11582
  See application file for complete search history.

(56) References Cited

U.S. PATENT DOCUMENTS

| | | | |
|---|---|---|---|
| 2018/0342455 A1* | 11/2018 | Nosho | ............... H01L 27/11575 |
| 2019/0006381 A1 | 1/2019 | Nakatsuji et al. | |
| 2019/0229125 A1 | 7/2019 | Zhou et al. | |

FOREIGN PATENT DOCUMENTS

| | | | |
|---|---|---|---|
| CN | 110192269 A | 8/2019 | |
| CN | 110249427 A | 9/2019 | |
| CN | 110291631 A | 9/2019 | |
| TW | 507367 B | 10/2002 | |

* cited by examiner

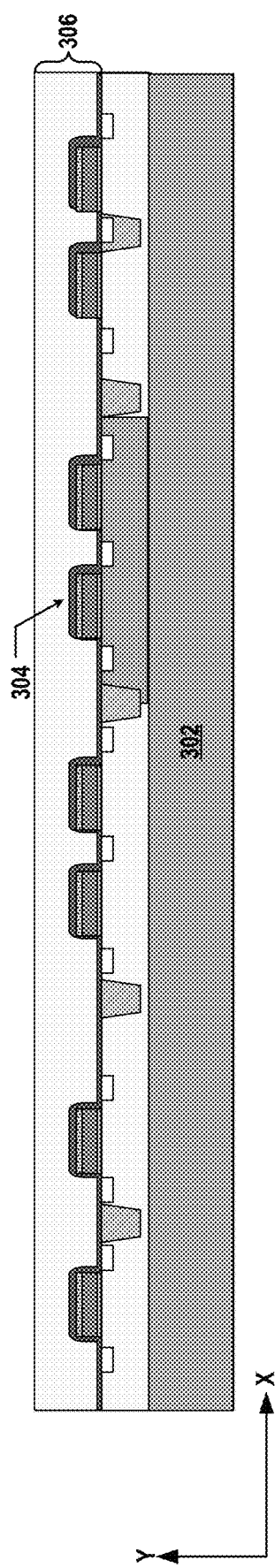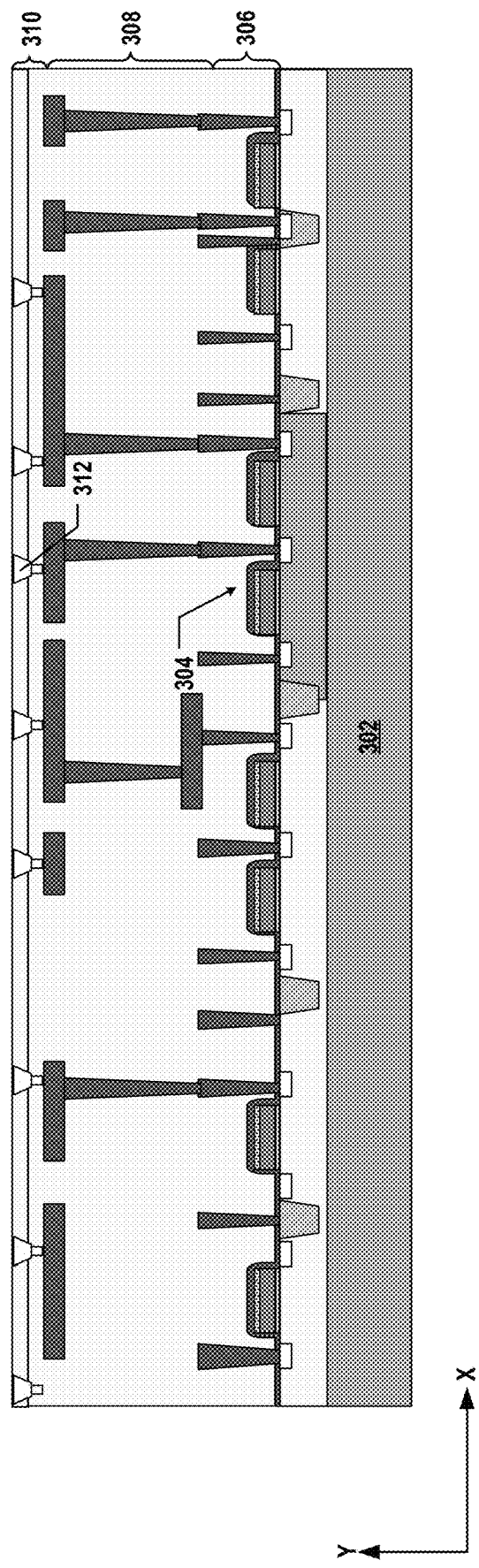
FIG. 3A
FIG. 3B

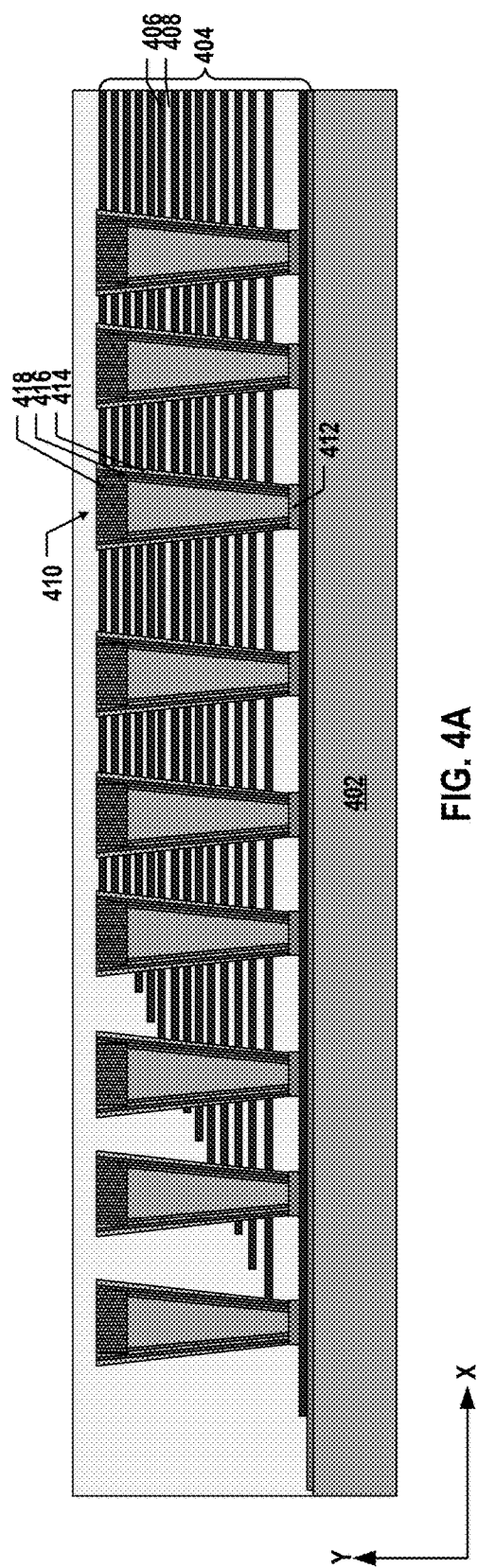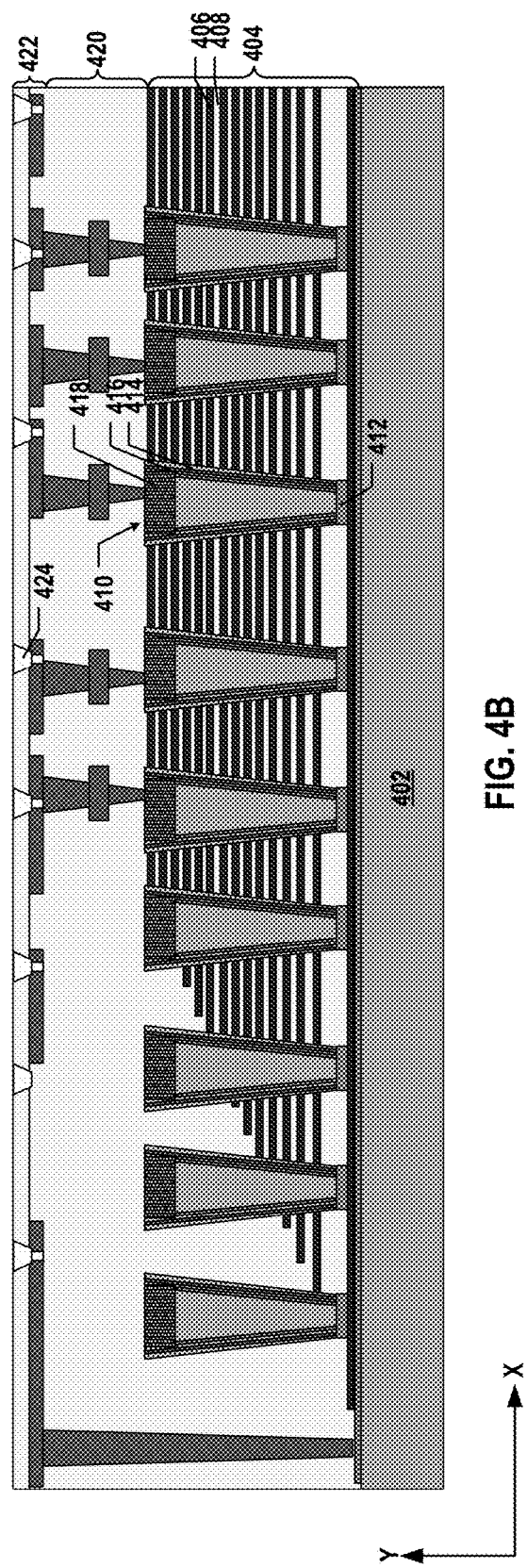
FIG. 4A
FIG. 4B

THREE-DIMENSIONAL MEMORY DEVICES HAVING HYDROGEN BLOCKING LAYER AND FABRICATION METHODS THEREOF

CROSS-REFERENCE TO RELATED APPLICATIONS

This application is continuation of International Application No. PCT/CN2019/110752, filed on Oct. 12, 2019, entitled "THREE-DIMENSIONAL MEMORY DEVICES HAVING HYDROGEN BLOCKING LAYER AND FABRICATION METHODS THEREOF," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices have a hydrogen blocking layer and fabrication methods thereof are disclosed herein.

In one example, a 3D memory device includes a substrate, a memory stack including interleaved conductive layers and dielectric layers above the substrate, an array of NAND memory strings each extending vertically through the memory stack, a plurality of logic process-compatible devices above the array of NAND memory strings, a semiconductor layer above and in contact with the logic process-compatible devices, a pad-out interconnect layer above the semiconductor layer, and a hydrogen blocking layer vertically between the semiconductor layer and the pad-out interconnect layer and configured to block outgassing of hydrogen.

In another example, a 3D memory device includes a substrate, a first hydrogen blocking layer above the substrate, a plurality of logic process-compatible devices above the first hydrogen blocking layer, a semiconductor layer above and in contact with the logic process-compatible devices, a second hydrogen blocking layer above the semiconductor layer, and a pad-out interconnect layer above the second hydrogen blocking layer. The first hydrogen blocking layer and the second hydrogen blocking layer are configured to block outgassing of hydrogen from the logic process-compatible devices during fabrication of the 3D memory device.

In still another example, a method for form a 3D memory device is disclosed. An array of NAND memory strings each extending vertically above a first substrate are formed. A plurality of logic process-compatible devices are formed on a second substrate. The first substrate and the second substrate are bonded in a face-to-face manner. The logic process-compatible devices are above the array of NAND memory strings after the bonding. The second substrate is thinned to form a semiconductor layer above and in contact with the logic process-compatible devices.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 3A and 3B illustrate a fabrication process for forming an exemplary semiconductor structure having logic process-compatible devices, according to some embodiments.

FIGS. 4A and 4B illustrate a fabrication process for forming an exemplary semiconductor structure having 3D NAND memory strings, according to some embodiments.

Figure 1A:
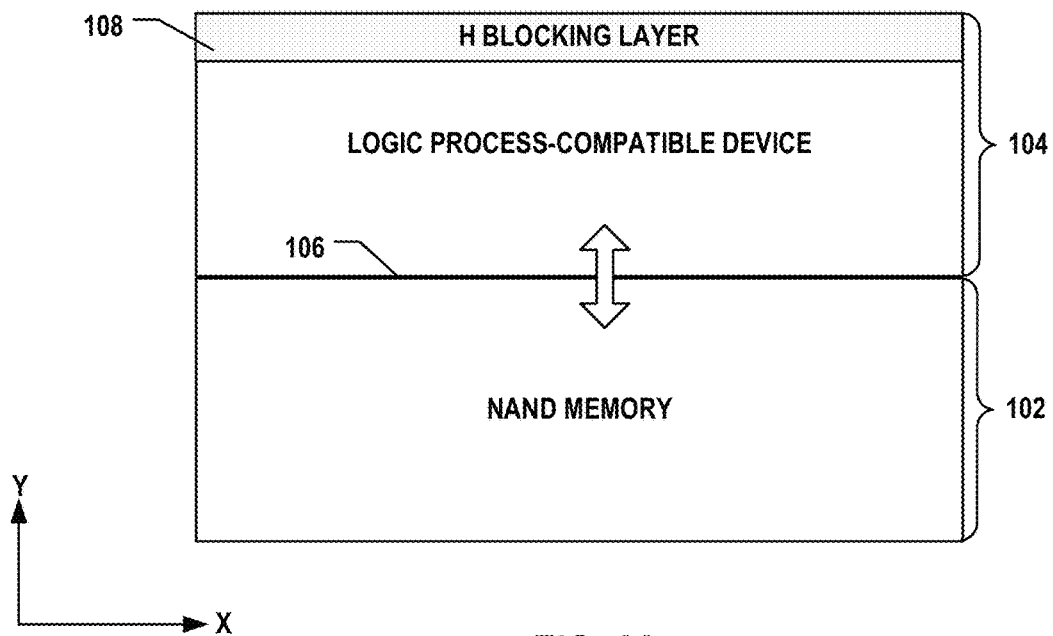
FIG. 1A illustrates a schematic view of a cross-section of an exemplary 3D memory device having a hydrogen blocking layer, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D NAND memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

In some existing 3D memory devices, 3D NAND memory string array and peripheral circuits are formed on two separate wafers and bonded together. Pad-out is accomplished through the 3D NAND cell array wafer. However, because cell array wafer pad-out has to land contacts outside the cell array, array efficiency may be significantly impacted. To improve the memory cell array efficiency, pad-out is implemented through the peripheral circuit wafer due to more chip area available for pad-out. However, hydrogen outgassing due to pad-out annealing may degrade the electrical performance of the transistors because of the existence of dangling bonds, which are supposed to be broken by hydrogen after pad-out annealing. Hydrogen may be released from the 3D memory devices in the form of hydrogen outgassing.

Various embodiments in accordance with the present disclosure provide 3D memory devices having one or more hydrogen blocking layers that block hydrogen outgassing from logic process-compatible devices (e.g., transistors) due to pad-out annealing, thereby suppressing the existence of dangling bonds and improving the electrical performance of the 3D memory devices. In some embodiments, the logic process-compatible devices are fully encapsulated with hydrogen blocking layers (and hydrogen blocking spaces surrounding contacts through the hydrogen blocking layers in some cases) to prevent hydrogen outgassing through the pad-out interconnect layer. As a result, pad-out through the peripheral circuit wafer can be enabled to improve memory cell array efficiency.

FIG. 1A illustrates a schematic view of a cross-section of an exemplary 3D memory device 100 having a hydrogen blocking layer, according to some embodiments. 3D memory device 100 represents an example of a bonded chip. The components of 3D memory device 100 (e.g., logic process-compatible devices and NAND memory) can be formed separately on different substrates and then joined to form a bonded chip. 3D memory device 100 can include a first semiconductor structure 102 having NAND memory, for example, an array of NAND memory cells. That is, first semiconductor structure 102 can be a NAND flash memory in which memory cells are provided in the form of an array of 3D NAND memory strings and/or an array of two dimensional (2D) NAND memory cells. NAND memory cells can be organized into pages which are then organized into blocks, in which each NAND memory cell is electrically connected to a separate line called a bit line (BL). All cells with the same position in the NAND memory cell can be electrically connected through the control gates by a word line (WL). In some embodiments, a memory plane contains a certain number of memory blocks that are electrically connected through the same bit line.

In some embodiments, the array of NAND memory cells is an array of 3D NAND memory strings, each of which extends vertically above the substrate (in 3D) through a memory stack. Depending on the 3D NAND technology (e.g., the number of layers/tiers in the memory stack), a 3D NAND memory string typically includes 32 to 256 NAND memory cells, each of which includes a floating-gate transistor or a charge-trapping transistor. In some embodiments, the array of NAND memory cells is an array of 2D NAND memory cells, each of which includes a floating-gate transistor. The array of 2D NAND memory cells includes a plurality of 2D NAND memory strings, each of which includes a plurality of memory cells (e.g., 32 to 128 memory cells) connected in series (resembling a NAND gate) and two select transistors, according to some embodiments. Each 2D NAND memory string is arranged in the same plane on the substrate (in 2D), according to some embodiments.

3D memory device 100 can also include a second semiconductor structure 104 including logic process-compatible devices above first semiconductor structure 102 including the NAND memory. In some embodiments, the logic process-compatible devices in second semiconductor structure 104 include any semiconductor device that can be fabricated in a way that is comparable to the fabrication processes for logic devices. For example, the logic process-compatible devices may include processors, controllers, random-access memory (RAM) (e.g., dynamic RAM (DRAM) or static (SRAM)), and peripheral circuits of memory devices, each of which includes a plurality of transistors. In some embodiments, the logic process-compatible devices include a processor, an array of RAM cells, and/or a peripheral circuit for the array of NAND memory cells (e.g., included in first semiconductor structure 102). In some embodiments, the logic process-compatible devices are formed using complementary metal-oxide-semiconductor (CMOS) technology. The logic process-compatible devices can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.) to achieve high speed.

In some embodiments, the logic process-compatible devices in second semiconductor structure 104 includes a flash memory controller that can manage the data stored in flash memory (either NAND Flash memory or NOR Flash memory) and communicate with a host (e.g., a processor of a computing device or any other electronic devices). In some embodiments, the flash memory controller is designed for operating in a low duty-cycle environment like Secure Digital (SD) cards, Compact Flash (CF) cards, USB Flash drives, or other media for use in electronic devices, such as personal computers, digital cameras, mobile phones, etc. In some embodiments, the flash memory controller is designed for operating in a high duty-cycle environment like solid-state drives (SSDs) or embedded Multi-Media-Cards (eMMCs) used as data storage for mobile devices, such as smartphones, tablets, laptop computers, etc., and enterprise storage arrays. The flash memory controller can be configured to control operations of flash memory (e.g., the NAND memory of first semiconductor structure 102 in FIG. 1A), such as read, write, erase, and program operations. The flash memory controller can also be configured to manage various functions with respect to the data stored or to be stored in the flash memory including, but not limited to bad-block management, garbage collection, logical-to-physical address conversion, wear leveling, and so on. In some embodiments, the flash memory controller is further configured to process error correction codes (ECCs) with respect to the data read from or written to the flash memory. Any other suitable functions may be performed by the flash memory controller as well, for example, formatting the flash memory.

In some embodiments, the logic process-compatible devices in second semiconductor structure 104 include peripheral circuits (also known as the control and sensing circuits) of the NAND memory of first semiconductor structure 102 in FIG. 1A. The peripheral circuits can include any suitable digital, analog, and/or mixed-signal circuits used for facilitating the operations of the NAND memory. For example, the peripheral circuits can include one or more of a page buffer, a decoder (e.g., a row decoder and a column decoder), a sense amplifier, a driver (e.g., a word line driver), a charge pump, a current or voltage reference, or any active or passive components of the circuits (e.g., transistors, diodes, resistors, or capacitors).

Besides logic devices/circuits, the logic process-compatible devices in second semiconductor structure 104 can also include RAM that is compatible with the logic processes, such as SRAM and DRAM. In some embodiments, SRAM is integrated on the same substrate of the logic circuits (e.g., the processors, controllers, and peripheral circuits), allowing wider bus and higher operation speed, which is also known as "on-die SRAM." The memory controller of the SRAM can be embedded as part of the peripheral circuits. In some embodiments, each SRAM cell includes a plurality of transistors for storing a bit of data as a positive or negative electrical charge as well as one or more transistors that control access to it. In one example, each SRAM cell has six transistors (e.g., metal-oxide-semiconductor field-effect transistors (MOSFETs)), for example, four transistors for storing a bit of data and two transistors for controlling access to the data. The SRAM cells can locate in the area that is not occupied by the logic circuits (e.g., the processor and peripheral circuits) and thus, do not need extra space to be formed. In one example, each DRAM cell includes a capacitor for storing a bit of data as a positive or negative electrical charge as well as one or more transistors that control access to it. For example, each DRAM cell may be a one-transistor, one-capacitor (1T1C) cell. The on-die RAM (e.g., on-die DRAM and/or on-die SRAM) can enable high-speed operations of 3D memory device 100, used as one or more caches (e.g., instruction cache or data cache) and/or data buffers. Also, the SRAM and/or DRAM cells can locate in the area that is not occupied by the logic circuits and thus, do not need extra space to be formed.

As shown in FIG. 1A, 3D memory device 100 further includes a bonding interface 106 vertically between first semiconductor structure 102 and second semiconductor structure 104. As described below in details, first and second semiconductor structures 102 and 104 can be fabricated separately (and in parallel in some embodiments) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short electrical connections between first semiconductor structure 102 and second semiconductor structure 104, as opposed to the long-distance chip-to-chip data bus on the circuit board (e.g., Printed Circuit Board (PCB)), thereby avoiding chip interface delay and achieving high-speed In/Out (I/O) throughput with reduced power consumption. Data transfer between the NAND memory in first semiconductor structure 102 and the logic process-compatible devices in second semiconductor structure 104 can be performed through the interconnects (e.g., bonding contacts) across bonding interface 106. By vertically integrating first and second semiconductor structures 102 and 104, the chip size can be reduced, and the memory cell density can be increased. Furthermore, by integrating multiple discrete chips into a single bonded chip (e.g., 3D memory device 100), faster system speed and smaller PCB size can be achieved as well.

As shown in FIG. 1A, since second semiconductor structure 104 having the logic process-compatible devices is above first semiconductor structure 102 having the NAND memory, the pad-out of 3D memory device 100 can be achieved above second semiconductor structure 104. To mitigate or prevent hydrogen outgassing due to the pad-out annealing process, second semiconductor structure 104 includes a hydrogen blocking layer 108 above the logic process-compatible devices. As described below in detail, hydrogen blocking layer 108 is configured to block outgassing of hydrogen, according to some embodiments. For example, hydrogen blocking layer 108 may be configured to block outgassing of the hydrogen from the logic process-compatible devices into or beyond the pad-out interconnect layer during fabrication of 3D memory device 100, in particular, when annealing the pad-out interconnect layer. In some embodiments, hydrogen blocking layer 108 includes a high dielectric constant (high-k) dielectric material, such as aluminum oxide ($Al_2O_3$). That is, hydrogen blocking layer 108 can be a high-k dielectric layer, for example, an aluminum oxide layer. A high-k dielectric layer, such as an aluminum oxide layer, can block the outgassing of hydrogen due to its material characteristics as well as shield the metal interconnects underneath to avoid coupling effect. It is understood that hydrogen blocking layer 108 may be a composite layer that includes sub-layers. The sub-layers may all be high-k dielectric sub-layers or only a subset of the sub-layers are high-k dielectric sub-layer while other sub-layers are not, according to some embodiments.

Figure 1B:
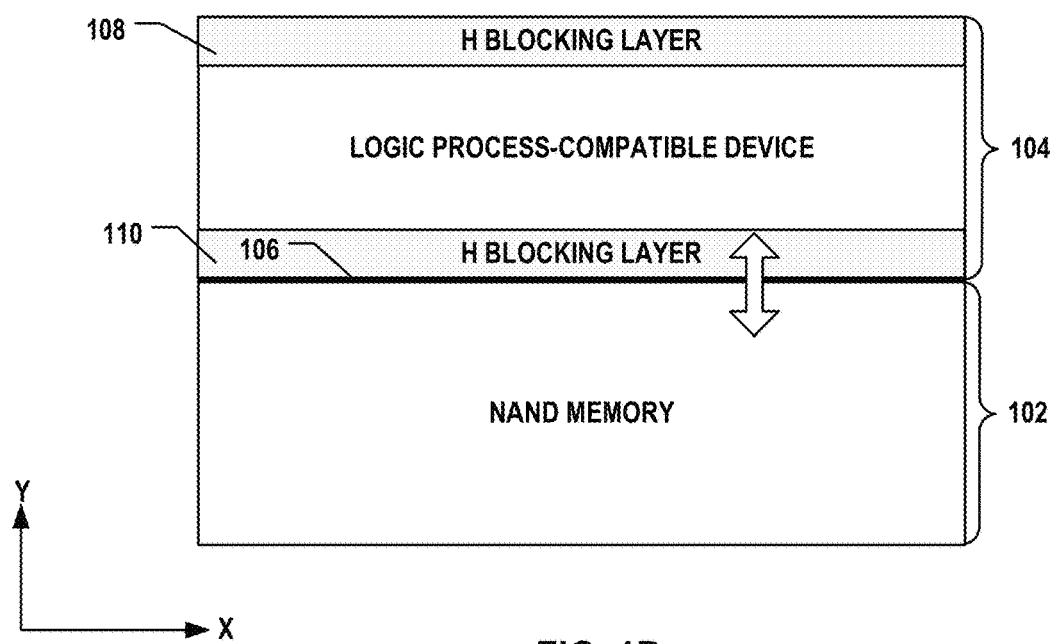
FIG. 1B illustrates a schematic view of a cross-section of an exemplary 3D memory device having two hydrogen blocking layers, according to some embodiments.

It is understood that more than one hydrogen blocking layer may be included in second semiconductor structure 104. FIG. 1B illustrates a schematic view of a cross-section of another exemplary 3D memory device 101 having hydrogen blocking layers, according to some embodiments. Besides hydrogen blocking layer 108 above the logic process-compatible devices, second semiconductor structure 104 in 3D memory device 101 further includes another hydrogen blocking layer 110 below the logic process-compatible devices to fully encapsulate the logic process-compatible devices for hydrogen outgassing. Hydrogen blocking layers 108 and 110 can be formed at both the front side and the backside of second semiconductor structure 104 to enhance the blockage of hydrogen outgassing. In some embodiments, hydrogen blocking layer 110 is disposed vertically between the logic process-compatible devices and bonding interface 106, which also blocks the outgassing of hydrogen downwards through bonding interface 106 during fabrication of 3D memory device 101. In some embodiments, hydrogen blocking layer 110 includes a high-k dielectric material, such as aluminum oxide. That is, hydrogen blocking layer 110 can be a high-k dielectric layer, for example, an aluminum oxide layer.

Figure 2A:
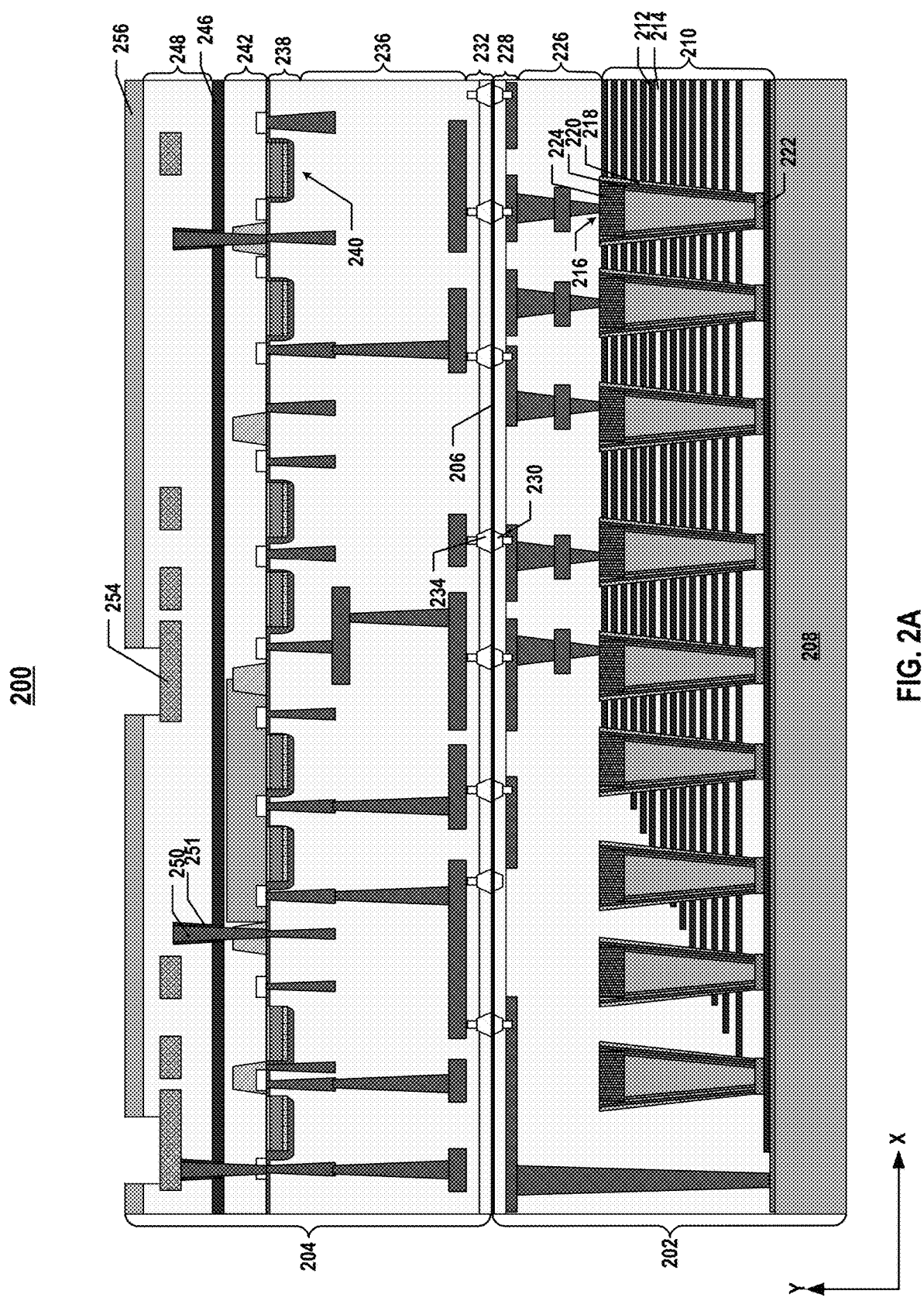
FIG. 2A illustrates a schematic plan view of an exemplary 3D memory device having a hydrogen blocking layer, according to some embodiments.

FIG. 2A illustrates a schematic plan view of an exemplary 3D memory device 200 having a hydrogen blocking layer, according to some embodiments. As one example of 3D memory device 100 described above with respect to FIG. 1A, 3D memory device 200 is a bonded chip including a first semiconductor structure 202 and a second semiconductor structure 204 stacked over first semiconductor structure 202. First and second semiconductor structures 202 and 204 are joined at a bonding interface 206 therebetween, according to some embodiments. Second semiconductor structure 204 includes a hydrogen blocking layer 246 configured to block outgassing of hydrogen as described below in detail, according to some embodiments. As shown in FIG. 2A, first semiconductor structure 202 can include a substrate 208, which can include silicon (e.g., single crystalline silicon), silicon germanium (SiGe), gallium arsenide (GaAs), germanium (Ge), silicon on insulator (SOI), or any other suitable materials. It is noted that x- and y-axes are added in FIG. 2A to further illustrate the spatial relationship of the components in 3D memory device 200. Substrate 208 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 200) is determined relative to the substrate of the semiconductor device (e.g., substrate 208) in the y-direction (the vertical direction or thickness direction) when the substrate is positioned in the lowest plane of the semiconductor device in the y-direction. The same notion for describing the spatial relationship is applied throughout the present disclosure.

As shown in FIG. 2A, first semiconductor structure 202 of 3D memory device 200 includes a NAND flash memory in which memory cells are provided in the form of an array of 3D NAND memory strings 216 above substrate 208. Each 3D NAND memory string 216 extends vertically through a plurality of pairs each including a conductive layer 212 and a dielectric layer 214, according to some embodiments. The stacked and interleaved conductive layers 212 and dielectric layer 214 are also referred to herein as a "memory stack" 210. Interleaved conductive layers 212 and dielectric layers 214 in memory stack 210 alternate in the vertical direction, according to some embodiments. In other words, except the ones at the top or bottom of memory stack 210, each conductive layer 212 can be adjoined by two dielectric layers 214 on both sides, and each dielectric layer 214 can be adjoined by two conductive layers 212 on both sides. Conductive layers 212 can each have the same thickness or different thicknesses. Similarly, dielectric layers 214 can each have the same thickness or different thicknesses. Conductive layers 212 can include conductive materials including, but not limited to, tungsten (W), cobalt (Co), copper (Cu), aluminum (Al), doped silicon, silicides, or any combination thereof. Dielectric layers 214 can include dielectric materials including, but not limited to, silicon oxide, silicon nitride, silicon oxynitride, or any combination thereof.

In some embodiments, each 3D NAND memory string 216 is a "charge trap" type of NAND memory string including a semiconductor channel 220 and a memory film 218. In some embodiments, semiconductor channel 220 includes silicon, such as amorphous silicon, polysilicon, or single crystalline silicon. In some embodiments, memory film 218 is a composite dielectric layer including a tunneling layer, a storage layer (also known as "charge trap/storage layer"), and a memory blocking layer. Each 3D NAND memory string 216 can have a cylinder shape (e.g., a pillar shape). Semiconductor channel 220, the tunneling layer, the storage layer, and the memory blocking layer of memory film 218 are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The memory blocking layer can include silicon oxide, silicon oxynitride, high-k dielectrics, or any combination thereof. In one example, the memory blocking layer can include a composite layer of silicon oxide/silicon oxynitride/silicon oxide (ONO). In another example, the memory blocking layer can include a high-k dielectric layer, such as aluminum oxide ($Al_2O_3$), hafnium oxide ($HfO_2$), zirconium oxide ($ZrO_2$), or tantalum oxide ($Ta_2O_5$) layer, and so on.

In some embodiments, 3D NAND memory strings 216 further include a plurality of control gates (each being part of a word line). Each conductive layer 212 in memory stack 210 can act as a control gate for each memory cell of 3D NAND memory string 216. In some embodiments, each 3D NAND memory string 216 includes two plugs 222 and 224 at the respective end in the vertical direction. Plug 222 can include a semiconductor material, such as single-crystal silicon, that is epitaxially grown from substrate 208. Plug 222 can function as the channel controlled by a source select gate of 3D NAND memory string 216. Plug 222 can be at the lower end of 3D NAND memory string 216 and in contact with semiconductor channel 220. As used herein, the "upper end" of a component (e.g., 3D NAND memory string 216) is the end farther away from substrate 208 in the y-direction, and the "lower end" of the component (e.g., 3D NAND memory string 216) is the end closer to substrate 208 in the y-direction when substrate 208 is positioned in the lowest plane of 3D memory device 200. Another Plug 224 can include semiconductor materials (e.g., polysilicon). By covering the upper end of 3D NAND memory string 216 during the fabrication of first semiconductor structure 202, plug 224 can function as an etch stop layer to prevent etching of dielectrics filled in 3D NAND memory string 216, such as silicon oxide and silicon nitride. In some embodiments, plug 224 functions as the drain of 3D NAND memory string 216.

It is understood that 3D NAND memory strings 216 are not limited to the "charge trap" type of 3D NAND memory strings and may be a "floating gate" type of 3D NAND memory strings in other embodiments. In some embodiments, a polysilicon layer as the source plate of the "floating gate" type of 3D NAND memory strings may be formed between substrate 208 and memory stack 210.

In some embodiments, first semiconductor structure 202 of 3D memory device 200 further includes an interconnect layer 226 above memory stack 210 and 3D NAND memory strings 216 to transfer electrical signals to and from memory stack 210 and 3D NAND memory strings 216. Interconnect layer 226 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 226 can further include one or more inter-layer dielectric (ILD) layers (also known as "inter-metal dielectric (IMD) layers" for BEOL) in which the interconnect lines and via contacts can form. That is, interconnect layer 226 can include interconnect lines and via contacts in multiple interlayer dielectric (ILD) layers. The interconnect lines and via contacts in interconnect layer 226 can include conductive materials including, but not limited to, W, Co, Cu, Al, silicides, or any combination thereof. The ILD layers in interconnect layer 226 can include dielectric materials including, but not limited to, silicon oxide, silicon nitride, silicon oxynitride, low dielectric constant (low-k) dielectrics, or any combination thereof.

As shown in FIG. 2A, first semiconductor structure 202 of 3D memory device 200 can further include a bonding layer 228 at bonding interface 206 and above interconnect layer 226 and memory stack 210 (and 3D NAND memory strings 216 therethrough). That is, interconnect layer 226 is vertically between array of 3D NAND memory strings 216 and bonding layer 228, according to some embodiments. Bonding layer 228 can include a plurality of bonding contacts 230 and dielectrics electrically isolating bonding contacts 230 from each other. Bonding contacts 230 can include conductive materials including, but not limited to, W, Co, Cu, Al, silicides, or any combination thereof. The remaining area of bonding layer 228 can be formed with dielectrics including, but not limited to, silicon oxide, silicon nitride, silicon oxynitride, low-k dielectrics, or any combination thereof.

Similarly, as shown in FIG. 2A, second semiconductor structure 204 of 3D memory device 200 can also include a bonding layer 232 at bonding interface 206 and above bonding layer 228 of first semiconductor structure 202. Bonding layer 232 can include a plurality of bonding contacts 234 and dielectrics electrically isolating bonding contacts 234 from each other. Bonding contacts 234 can include conductive materials including, but not limited to, W, Co, Cu, Al, silicides, or any combination thereof. The remaining area of bonding layer 232 can be formed with dielectrics including, but not limited to, silicon oxide, silicon nitride, silicon oxynitride, low-k dielectrics, or any combination thereof.

As described above, second semiconductor structure 204 can be bonded on top of first semiconductor structure 202 in a face-to-face manner at bonding interface 206. Bonding contacts 230 of first semiconductor structure 202 are in contact with bonding contacts 234 of second semiconductor structure 204 at bonding interface 206, according to some embodiments. In some embodiments, bonding interface 206 is disposed between bonding layers 232 and 228 as a result of hybrid bonding (also known as "metal/dielectric hybrid bonding"), which is a direct bonding technology (e.g., forming bonding between surfaces without using intermediate layers, such as solder or adhesives) that obtains metal-metal bonding and dielectric-dielectric bonding simultaneously. In some embodiments, bonding interface 206 is the place at which bonding layers 232 and 228 are met and bonded. In practice, bonding interface 206 can be a layer with a certain thickness that includes the top surface of bonding layer 228 of first semiconductor structure 202 and the bottom surface of bonding layer 232 of second semiconductor structure 204.

In some embodiments, second semiconductor structure 204 of 3D memory device 200 further includes an interconnect layer 236 above bonding layer 232 to transfer electrical signals. Interconnect layer 236 can include a plurality of interconnects, such as MEOL interconnects and BEOL interconnects. Interconnect layer 236 can further include one or more ILD layers in which the interconnect lines and via contacts can form. The interconnect lines and via contacts in interconnect layer 236 can include conductive materials including, but not limited to, W, Co, Cu, Al, silicides, or any combination thereof. The ILD layers in interconnect layer 236 can include dielectric materials including, but not limited to, silicon oxide, silicon nitride, silicon oxynitride, low-k dielectrics, or any combination thereof.

In some embodiments, second semiconductor structure 204 of 3D memory device 200 further includes a device layer 238 above interconnect layer 236 and bonding layer 232. Device layer 238 can include a plurality of logic process-compatible devices each including a plurality of transistors 240. That is, interconnect layer 236 is vertically between the logic process-compatible devices in device layer 238 and bonding layer 232, according to some embodiments. In some embodiments, the logic process-compatible devices include a flash memory controller and/or peripheral circuits of array of 3D NAND memory strings 216. The peripheral circuit, i.e., any suitable digital, analog, and/or mixed-signal control and sensing circuits used for facilitating the operation of the 3D NAND memory can include, but not limited to, a page buffer, a decoder (e.g., a row decoder and a column decoder), a sense amplifier, a driver (e.g., a word line driver), a charge pump, a current or voltage reference. Transistors 240 can be formed "on" a semiconductor layer 242, in which the entirety or part of transistors 240 are formed in semiconductor layer 242 (e.g., above the top surface of semiconductor layer 242) and/or directly on semiconductor layer 242. Isolation regions (e.g., shallow trench isolations (STIs)) and doped regions (e.g., source regions and drain regions of transistors 240) can be formed on semiconductor layer 242 as well. Transistors 240 are high-speed logic transistors with advanced logic processes (e.g., technology nodes of 90 nm, 65 nm, 55 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, second semiconductor structure 204 further includes semiconductor layer 242 disposed above device layer 238. Semiconductor layer 242 can be a thinned substrate on which transistors 240 of the logic process-compatible devices are formed. In some embodiments, semiconductor layer 242 includes single-crystal silicon. In some embodiments, semiconductor layer 242 can include polysilicon, amorphous silicon, SiGe, GaAs, Ge, or any other suitable materials. Semiconductor layer 242 can also include isolation regions and doped regions (e.g., functioning as the sources/drains of transistors 240). Isolation regions (not shown) can extend across the entire thickness or part of the thickness of semiconductor layer 242 to electrically isolate the doped regions.

As shown in FIG. 2A, second semiconductor structure 204 of 3D memory device 200 can further include a pad-out interconnect layer 248 above semiconductor layer 242. Pad-out interconnect layer 248 include interconnects, e.g., contact pads 254, in one or more ILD layers. Pad-out interconnect layer 248 and interconnect layer 236 can be formed at opposite sides of semiconductor layer 242. In some embodiments, the interconnects in pad-out interconnect layer 248 can transfer electrical signals between 3D memory device 200 and outside circuits, e.g., for pad-out purposes. The interconnect (e.g., contact pads 254) in pad-out interconnect layer 248 can include conductive materials including, but not limited to, W, Co, Cu, Al, silicides, or any combination thereof. The ILD layers in pad-out interconnect layer 248 can include dielectric materials including, but not limited to, silicon oxide, silicon nitride, silicon oxynitride, low-k dielectrics, or any combination thereof.

In some embodiments, second semiconductor structure 204 further includes a passivation layer 256 above pad-out interconnect layer 248. Passivation layer 256 can include silicon nitride. In some embodiments, passivation layer 256 includes silicon nitride rich in hydrogen, which can act as a hydrogen source from which the hydrogen can diffuse into device layer 238 as needed. The silicon nitride rich in hydrogen can include hydrogenated silicon nitride ($SiN_x$:H). In some embodiments, the hydrogen concentration in the silicon nitride rich in hydrogen is greater than $10^{21}$ atom/$cm^3$, such as between $10^{21}$ atom/$cm^3$ and $10^{23}$ atom/$cm^3$. In some embodiments, the hydrogen concentration in the silicon nitride rich in hydrogen is greater than $10^{22}$ atom/$cm^3$, such as between $10^{22}$ atom/$cm^3$ and $10^{23}$ atom/$cm^3$. In some embodiments, passivation layer 256 is a composite layer having a layer of silicon nitride and a layer of silicon oxide. As shown in FIG. 2A, openings can be formed through passivation layer 256 to expose contact pads 254 in pad-out interconnect layer 248.

As described above, hydrogen needs to be supplemented (e.g., by ion implantation and/or diffusion) to transistors 240 of the logic process-compatible devices in device layer 238 to break dangling bonds. On the other hand, the formation of pad-out interconnect layer 248 involves an anneal process that can accelerate the outgassing of hydrogen, thereby reducing the hydrogen in device layer 238. To solve the issue of hydrogen outgassing, different from some existing 3D memory devices, second semiconductor structure 204 of 3D memory device 200 further includes hydrogen blocking layer 246 disposed vertically between semiconductor layer 242 and pad-out interconnect layer 248, as illustrated in FIG. 2A. Hydrogen blocking layer 246 is configured to block outgassing of hydrogen, according to some embodiments. For example, hydrogen blocking layer 246 may be configured to block outgassing of the hydrogen from the logic process-compatible devices (e.g., transistors 240 in device layer 238) into or beyond pad-out interconnect layer 248 during fabrication of 3D memory device 200. In some embodiments, hydrogen blocking layer 246 extends laterally to cover semiconductor layer 242 to prevent the outgassing of the hydrogen upwards from device layer 238 toward pad-out interconnect layer 248. That is, hydrogen blocking layer 246 can encapsulate the logic process-compatible devices in device layer 238 above device layer 238.

Hydrogen blocking layer 246 can include a high-k dielectric material including, for example, aluminum oxide ($Al_2O_3$), hafnium oxide ($HfO_2$), zirconium oxide ($ZrO_2$), or tantalum oxide ($Ta_2O_5$) layer. In some embodiments, hydrogen blocking layer 246 includes aluminum oxide. For example, hydrogen blocking layer 246 may be an aluminum oxide layer. It is understood that in some embodiments, hydrogen blocking layer 246 may be a composite layer having multiple high-k dielectric sub-layers or a high-k dielectric sub-layer along with one or more sub-layers of other materials. The thickness of hydrogen blocking layer 246 can be sufficiently thick to block the outgassing of hydrogen. In some embodiments, the thickness of hydrogen blocking layer 246 is between about 1 nm and about 100 nm, such as between 1 nm and 100 nm (e.g., 1 nm, 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, any range bounded by the lower end by any of these values, or in any range defined by any two of these values).

In some embodiments, second semiconductor structure 204 further includes one or more contacts 250 extending vertically through hydrogen blocking layer 246 and semiconductor layer 242 to electrically connect pad-out interconnect layer 248 and interconnect layers 236 and 226. Device layer 238 (and the logic process-compatible devices therein, such as the peripheral circuits) can be electrically connected to array of 3D NAND memory strings 216 through interconnect layers 236 and 226 as well as bonding contacts 234 and 230. Moreover, device layer 238 and array of 3D NAND memory strings 216 can be electrically connected to outside circuits through contacts 250 and pad-out interconnect layer 248. In some embodiments, a hydrogen blocking spacer 251 is formed between each contact 250 and hydrogen blocking layer 246 to prevent the hydrogen outgassing through the area surrounding contact 250. For example, hydrogen blocking spacer 251 may surround contact 250. Hydrogen blocking spacer 251 includes the same material as hydrogen blocking layer 246, such as aluminum oxide, according to some embodiments. As a result, the encapsulation of device layer 238 from the top can be further enhanced by hydrogen blocking spacers 251.

Figure 2B:
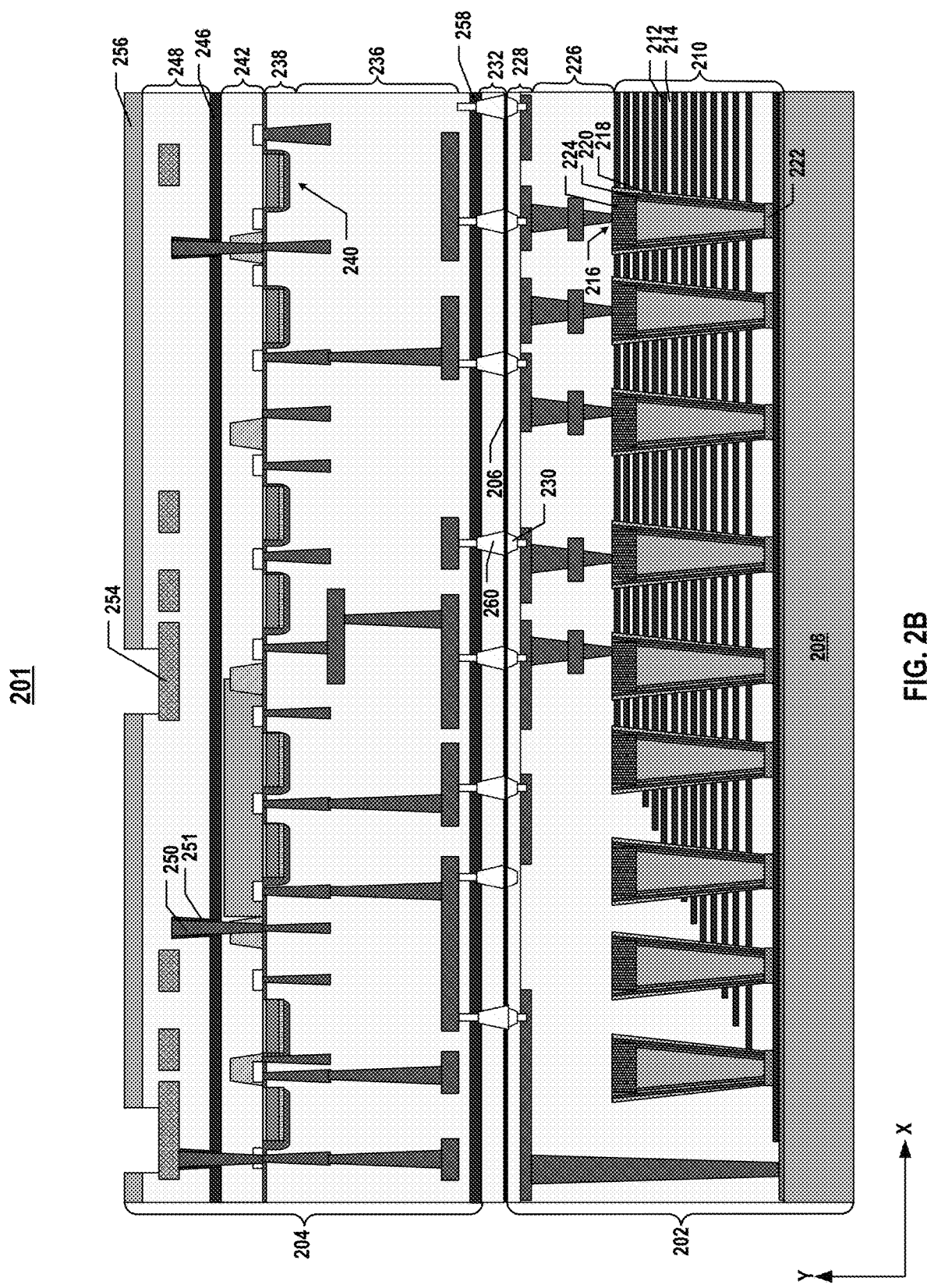
FIG. 2B illustrates a schematic plan view of an exemplary 3D memory device having two hydrogen blocking layers, according to some embodiments.

FIG. 2B illustrates a schematic plan view of an exemplary 3D memory device 201 having two hydrogen blocking layers, according to some embodiments. 3D memory device 201 is substantially similar to 3D memory device 200 except for including another hydrogen blocking layer 258 between bonding interface 206 and interconnect layer 236 of second semiconductor structure 204. By including two hydrogen blocking layers 246 and 258 above and below device layer 238 in second semiconductor structure 204, the outgassing of hydrogen can be blocked in both vertical directions (i.e., upwards and downwards). The details of similar structures (e.g., materials, fabrication process, functions, etc.) in both 3D memory devices 200 and 201 are not repeated.

As illustrated in FIG. 2B, 3D memory device 201 can include substrate 208, memory stack 210 above substrate 208, array of 3D NAND memory strings 216 extending vertically through memory stack 210, interconnect layer 226 above array of 3D NAND memory strings 216, and bonding layer 228 above interconnect layer 226. 3D memory device 201 can also include bonding layer 232, which includes bonding contacts 260, on the opposite side of bonding interface 206 of bonding layer 228. 3D memory device 201 can further include hydrogen blocking layer 258 above bonding layer 232 and bonding interface 206 and interconnect layer 236 above hydrogen blocking layer 258. 3D memory device 201 can further include logic process-compatible devices in device layer 238 above interconnect layer 236 and semiconductor layer 242 above device layer 238 and in contact with the logic process-compatible devices in device layer 238. Similar to 3D memory device 200, 3D memory device 201 also includes hydrogen blocking layer 246 above semiconductor layer 242 for blocking the hydrogen outgassing from device layer 238 into or beyond pad-out interconnect layer 248 above hydrogen blocking layer 246 during fabrication of 3D memory device 201.

Different from 3D memory device 200 having single hydrogen blocking layer 246 as shown in FIG. 1A, 3D memory device 201 further includes an additional hydrogen blocking layer 258 vertically between bonding layer 232 and the logic process-compatible devices in device layer 238, according to some embodiments. Hydrogen blocking layer 258 is configured to block outgassing of hydrogen, according to some embodiments. For example, hydrogen blocking layer 258 may be configured to block outgassing of the hydrogen from the logic process-compatible devices (e.g., transistors 240 in device layer 238) into or beyond bonding layer 232 during fabrication of 3D memory device 201. In some embodiments, hydrogen blocking layer 258 extends laterally to cover interconnect layer 236 to prevent the outgassing of the hydrogen downwards from device layer 238 toward bonding layer 232. That is, hydrogen blocking layer 258 can encapsulate the logic process-compatible devices in device layer 238 below device layer 238. As a result, hydrogen blocking layers 246 and 258 extend laterally to encapsulate the logic process-compatible devices in device layer 238 in the vertical direction, i.e., above and below device layer 238, respectively.

Hydrogen blocking layer 258 can include a high-k dielectric material including, for example, aluminum oxide ($Al_2O_3$), hafnium oxide ($HfO_2$), zirconium oxide ($ZrO_2$), or tantalum oxide ($Ta_2O_5$) layer. In some embodiments, hydrogen blocking layer 258 includes aluminum oxide. For example, hydrogen blocking layer 258 may be an aluminum oxide layer. It is understood that in some embodiments, hydrogen blocking layer 258 may be a composite layer having multiple high-k dielectric sub-layers or a high-k dielectric sub-layer along with one or more sub-layers of other materials. The thickness of hydrogen blocking layer 258 can be sufficiently thick to block the outgassing of hydrogen. In some embodiments, the thickness of hydrogen blocking layer 258 is between about 1 nm and about 100 nm, such as between 1 nm and 100 nm (e.g., 1 nm, 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, any range bounded by the lower end by any of these values, or in any range defined by any two of these values). In some embodiments, hydrogen blocking layers 246 and 258 have the same thickness and/or the same material. It is understood that hydrogen blocking layers 246 and 258 may have different thicknesses and/or different materials in some embodiments.

In some embodiments, bonding contacts 260 in bonding layer 232 extend vertically through hydrogen blocking layer 258 to electrically connect the interconnects in interconnect layer 236 and bonding contacts 230 in bonding layer 228 across bonding interface 206. Although not shown in FIG. 2B, it is understood that in some embodiments, a hydrogen blocking spacer is formed between each bonding contact 260 and hydrogen blocking layer 258 to prevent the hydrogen outgassing through the area surrounding bonding contact 260. For example, the hydrogen blocking spacer may surround bonding contact 260. The hydrogen blocking spacer includes the same material as hydrogen blocking layer 258, such as aluminum oxide, according to some embodiments.

FIGS. 3A and 3B illustrate a fabrication process for forming an exemplary semiconductor structure having logic process-compatible devices, according to some embodiments. FIGS. 4A and 4B illustrate a fabrication process for forming an exemplary semiconductor structure having 3D NAND memory strings, according to some embodiments. FIGS. 5A-5D illustrate a fabrication process for forming an exemplary 3D memory device having a hydrogen blocking layer, according to some embodiments. FIG. 6 is a flowchart of an exemplary method 600 for forming 3D memory device having a hydrogen blocking layer, according to some embodiments. Examples of the memory device depicted in FIGS. 3A,3B, 4A, 4B, 5A-5D, and 6 include 3D memory device 200 depicted in FIG. 2A. FIGS. 3A,3B, 4A, 4B, 5A-5D, and 6 will be described together. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, method 600 starts at operation 602, in which an array of NAND memory strings each extending vertically is formed above a first substrate. The first substrate can be a silicon substrate. In some embodiments, a memory stack through which the array of NAND memory strings extend vertically is formed above the first substrate.

As illustrated in FIG. 4A, interleaved sacrificial layers (not shown) and dielectric layers 408 are formed above a silicon substrate 402. The interleaved sacrificial layers and dielectric layers 408 can form a dielectric stack (not shown). In some embodiments, each sacrificial layer includes a layer of silicon nitride, and each dielectric layer 408 includes a layer of silicon oxide. The interleaved sacrificial layers and dielectric layers 408 can be formed by one or more thin film deposition processes including, but not limited to, chemical vapor deposition (CVD), physical vapor deposition (PVD), atomic layer deposition (ALD), or any combination thereof. In some embodiments, a memory stack 404 can be formed by a gate replacement process, e.g., replacing the sacrificial layers with conductive layers 406 using wet/dry etch of the sacrificial layers selective to dielectric layers 408 and filling the resulting recesses with conductive layers 406. As a result, memory stack 404 can include interleaved conductive layers 406 and dielectric layers 408. In some embodiments, each conductive layer 406 includes a metal layer, such as a layer of tungsten. It is understood that memory stack 404 may be formed by alternatingly depositing conductive layers (e.g., doped polysilicon layers) and dielectric layers (e.g., silicon oxide layers) without the gate replacement process in other embodiments. In some embodiments, a pad oxide layer including silicon oxide is formed between memory stack 404 and silicon substrate 402.

As illustrated in FIG. 4B, 3D NAND memory strings 410 are formed above silicon substrate 402, each of which extends vertically through interleaved conductive layers 406 and dielectric layers 408 of memory stack 404. In some embodiments, fabrication processes to form 3D NAND memory string 410 include forming a channel hole through memory stack 404 and into silicon substrate 402 using dry etching/and or wet etching, such as deep reactive-ion etching (DRIE), followed by epitaxially growing a plug 412 in the lower portion of the channel hole from silicon substrate 402. In some embodiments, fabrication processes to form 3D NAND memory string 410 also include subsequently filling the channel hole with a plurality of layers, such as a memory film 414 (e.g., a tunneling layer, a storage layer, and a blocking layer) and a semiconductor layer 416, using thin film deposition processes such as ALD, CVD, PVD, or any combination thereof. In some embodiments, fabrication processes to form 3D NAND memory string 410 further include forming another plug 418 in the upper portion of the channel hole by etching a recess at the upper end of 3D NAND memory string 410, followed by filling the recess with a semiconductor material using thin film deposition processes such as ALD, CVD, PVD, or any combination thereof.

Method 600 proceeds to operation 604, as illustrated in FIG. 6, in which a first interconnect layer is formed above the array of NAND memory strings above the first substrate. The first interconnect layer can include a first plurality of interconnects in one or more ILD layers. As illustrated in FIG. 4B, an interconnect layer 420 can be formed above 3D NAND memory strings 410. Interconnect layer 420 can include interconnects of MEOL and/or BEOL in a plurality of ILD layers to make electrical connections with 3D NAND memory strings 410. In some embodiments, interconnect layer 420 includes multiple ILD layers and interconnects therein formed in multiple processes. For example, the interconnects in interconnect layers 420 can include conductive materials deposited by one or more thin film deposition processes including, but not limited to CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 4B can be collectively referred to as interconnect layer 420.

Method 600 proceeds to operation 606, as illustrated in FIG. 6, in which a first bonding layer is formed above the first interconnect layer. The first bonding layer can include a plurality of first bonding contacts. As illustrated in FIG. 4B, a bonding layer 422 is formed above interconnect layer 420. Bonding layer 422 can include a plurality of bonding contacts 424 surrounded by dielectrics. In some embodiments, a dielectric layer is deposited on the top surface of interconnect layer 420 by one or more thin film deposition processes including, but not limited to, CVD, PVD, ALD, or any combination thereof. Bonding contacts 424 then can be formed through the dielectric layer and in contact with the interconnects in interconnect layer 420 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 600 proceeds to operation 608, as illustrated in FIG. 6, in which a plurality of logic process-compatible devices are formed on a second substrate. The second substrate can be a silicon substrate. The logic process-compatible devices can include a flash memory controller and/or peripheral circuit of the array of NAND memory strings.

As illustrated in FIG. 3A, a plurality of transistors 304 are formed on a silicon substrate 302. Transistors 304 can be formed by a plurality of processes including, but not limited to, photolithography, dry/wet etch, thin film deposition, thermal growth, implantation, CMP, and any other suitable processes. In some embodiments, doped regions are formed in silicon substrate 302 by ion implantation and/or thermal diffusion, which function, for example, as source regions and/or drain regions of transistors 304. In some embodiments, isolation regions (e.g., STIs) are also formed in silicon substrate 302 by wet/dry etch and thin film deposition. A device layer 306 including a plurality of logic process-compatible devices (each including transistors 304) is thereby formed. For example, transistors 304 can be patterned and made in different regions of device layer 306 to form a flash memory controller and/or peripheral circuits.

Method 600 proceeds to operation 610, as illustrated in FIG. 6, in which a second interconnect layer is formed above the logic process-compatible devices. The second interconnect layer can include a second plurality of interconnects in one or more ILD layers. As illustrated in FIG. 3B, an interconnect layer 308 can be formed above device layer 306 having the logic process-compatible devices. Interconnect layer 308 can include interconnects of MEOL and/or BEOL in a plurality of ILD layers to make electrical connections with the logic process-compatible devices in device layer 306. In some embodiments, interconnect layer 308 includes multiple ILD layers and interconnects therein formed in multiple processes. For example, the interconnects in interconnect layers 308 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 3B can be collectively referred to as interconnect layer 308.

Method 600 proceeds to operation 612, as illustrated in FIG. 6, in which a second bonding layer is formed above the second interconnect layer. The second bonding layer can include a plurality of second bonding contacts. As illustrated in FIG. 3B, a bonding layer 310 is formed above interconnect layer 308. Bonding layer 310 can include a plurality of bonding contacts 312 surrounded by dielectrics. In some embodiments, a dielectric layer is deposited on the top surface of interconnect layer 308 by one or more thin film deposition processes including, but not limited to, CVD, PVD, ALD, or any combination thereof. Bonding contacts 312 then can be formed through the dielectric layer and in contact with the interconnects in interconnect layer 308 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

It is understood that in some embodiments, prior to forming the second bonding layer, a hydrogen blocking layer may be formed above the second interconnect layer and the logic process-compatible devices on the second substrate. Although not in FIG. 3B, a hydrogen blocking layer may be formed by depositing one or more layers of high-k dielectric materials, such as aluminum oxide, on interconnect layer 308 using one or more thin film deposition process including, but not limited to, CVD, PVD, ALD, or any combination thereof. For example, the hydrogen blocking layer may be deposited using ALD. Bonding layer 310 then may be formed on the hydrogen blocking layer. Bonding contacts 312 may be formed through the hydrogen blocking layer using photolithography, etching, and metal deposition. A hydrogen blocking spacer including a layer of high-k dielectric material may be formed surrounding each bonding contact 312, i.e., between each bonding contact 312 and the hydrogen blocking layer, using thin film deposition process prior to the deposition of bonding contacts 312.

Method 600 proceeds to operation 614, as illustrated in FIG. 6, in which the first substrate and the second substrate are bonded in a face-to-face manner. The logic process-compatible devices are above the array of NAND memory strings after the bonding. In some embodiments, the first bonding layer and the second bonding layer are hybrid bonded, such that the first bonding contacts are in contact with the second bonding contacts at a bonding interface.

Figure 5A:
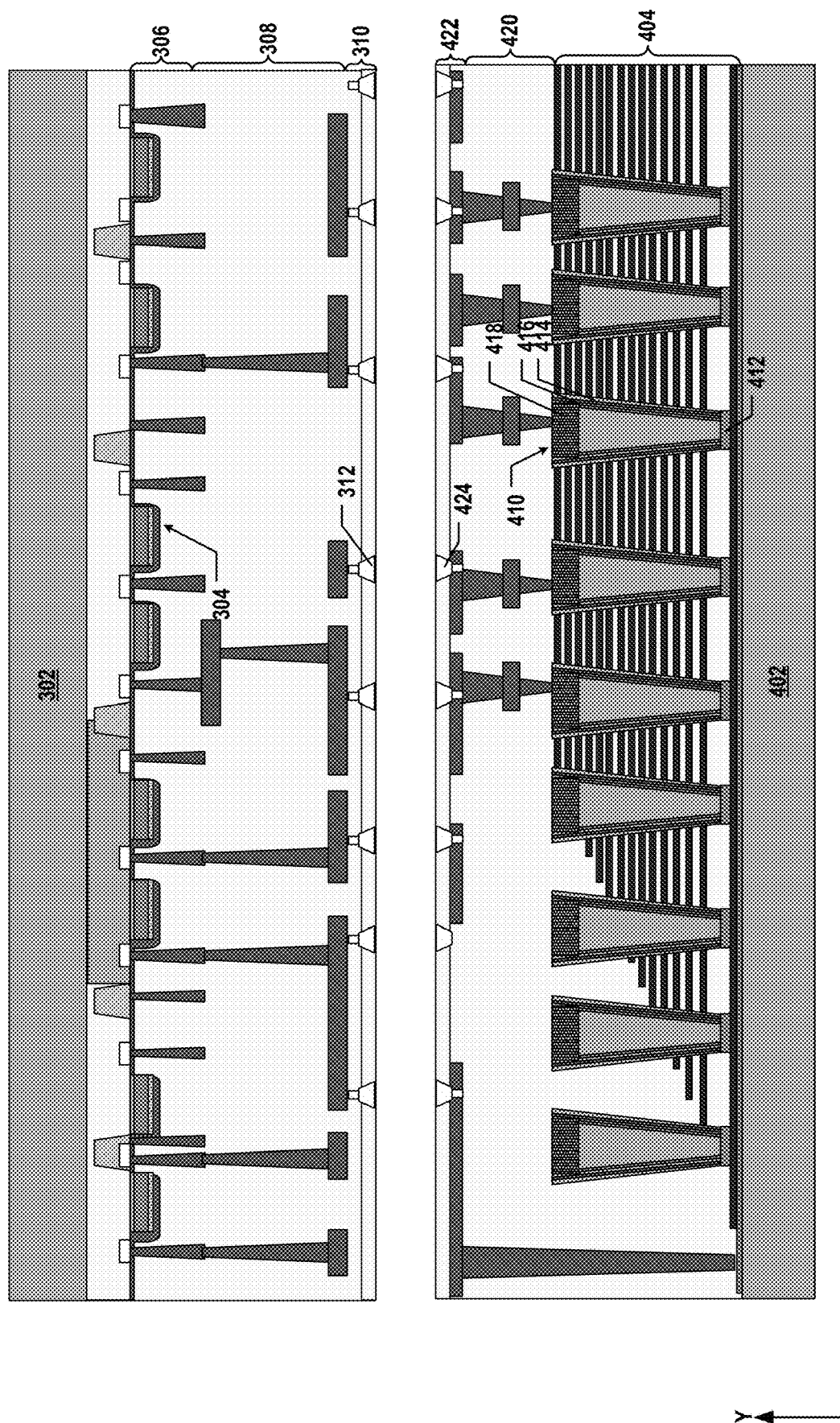
FIGS. 5A-5D illustrate a fabrication process for forming an exemplary 3D memory device having a hydrogen blocking layer, according to some embodiments.
Figure 5B:
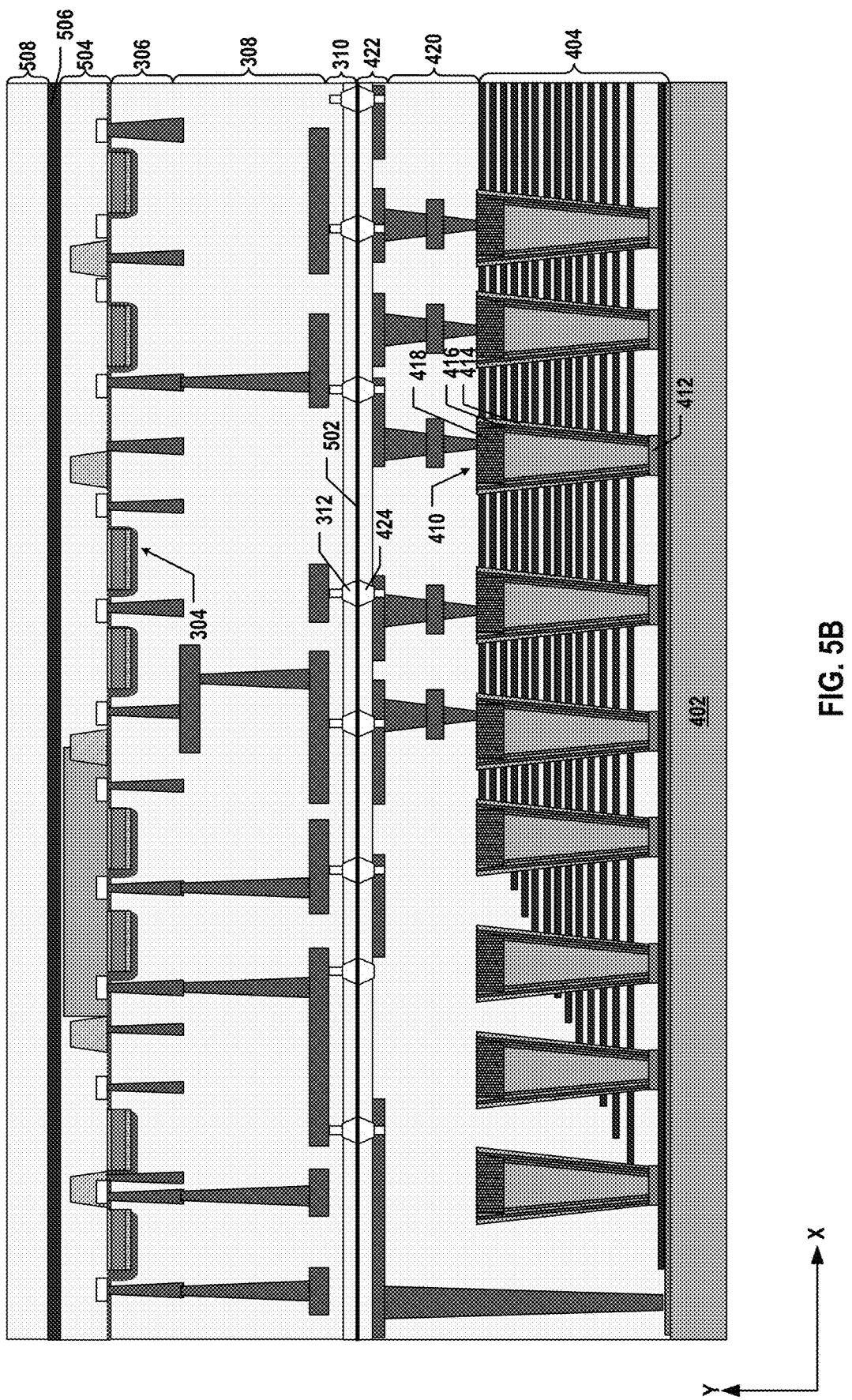
Figure 6:
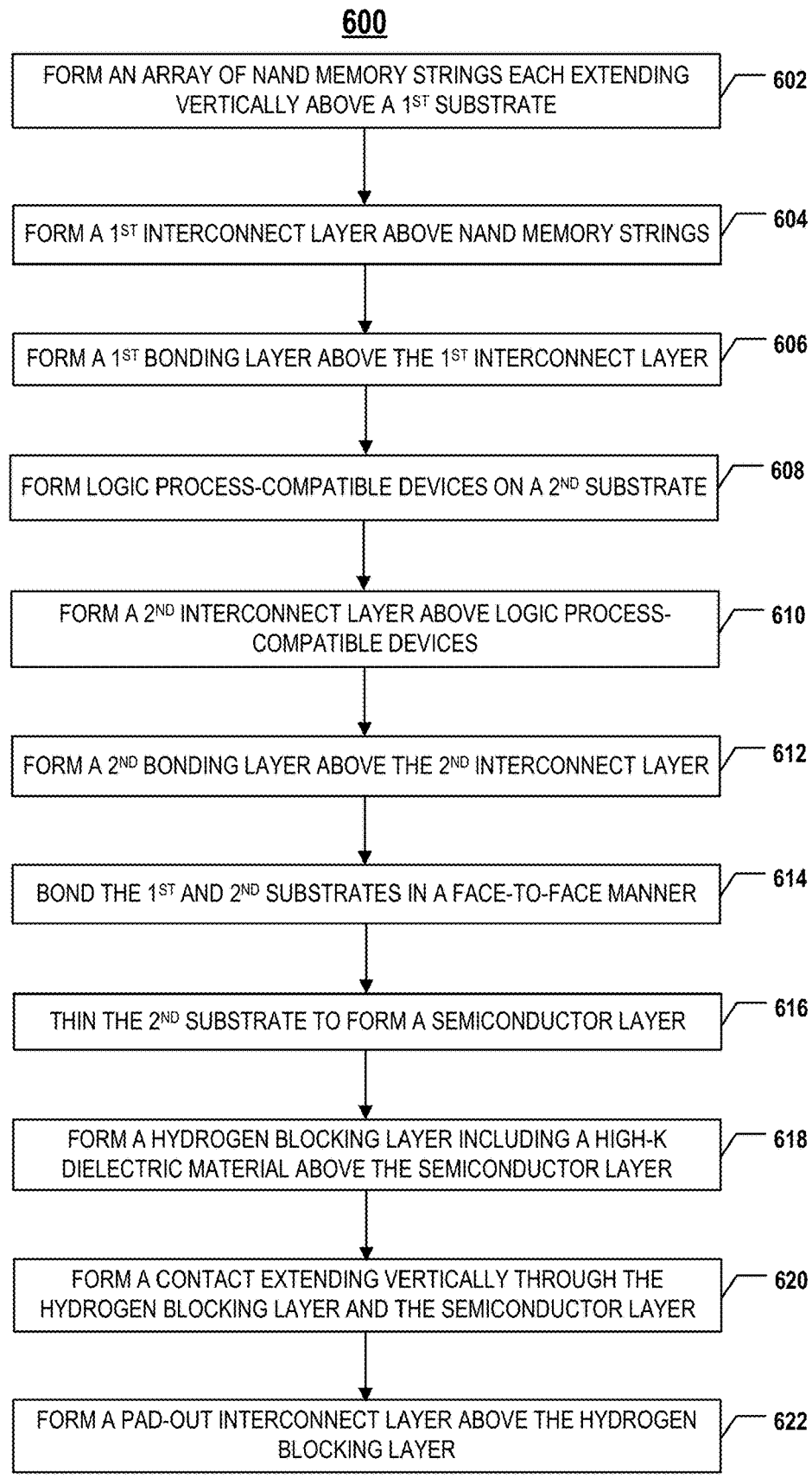
FIG. 6 is a flowchart of an exemplary method for forming 3D memory device having a hydrogen blocking layer, according to some embodiments.

As illustrated in FIG. 5A, silicon substrate 302 and components formed thereon (e.g., the logic process-compatible devices in device layer 306) are flipped upside down. Bonding layer 310 facing down is bonded with bonding layer 422 facing up, i.e., in a face-to-face manner, thereby forming a bonding interface 502 (as shown in FIG. 5B). In some embodiments, a treatment process, e.g., a plasma treatment, a wet treatment, and/or a thermal treatment, is applied to the bonding surfaces prior to the bonding. After the bonding, bonding contacts 312 in bonding layer 310 and bonding contacts 424 in bonding layer 422 are aligned and in contact with one another, such that device layer 306 (e.g., the logic process-compatible devices therein) can be electrically connected to 3D NAND memory strings 410. Bonding interface 502 can be formed between 3D NAND memory strings 410 and device layer 306 (e.g., the logic process-compatible devices therein) after the bonding as illustrated in FIG. 5B.

Method 600 proceeds to operation 616, as illustrated in FIG. 6, in which the second substrate is thinned to form a semiconductor layer above and in contact with the logic process-compatible devices. As illustrated in FIG. 5B, the substrate at the top of the bonded chip (e.g., silicon substrate 302 as shown in FIG. 5A) is thinned, so that the thinned top substrate can serve as a semiconductor layer 504, for example, a single crystalline silicon layer. The thickness of the thinned substrate can be between about 200 nm and about 5 µm, such as between 200 nm and 5 µm, or between about 150 nm and about 50 µm, such as between 150 nm and 50 µm. Silicon substrate 302 can be thinned by processes including, but not limited to, wafer grinding, dry etch, wet etch, CMP, any other suitable processes, or any combination thereof.

Method 600 proceeds to operation 618, as illustrated in FIG. 6, in which a hydrogen blocking layer above the semiconductor layer. The hydrogen blocking layer can include a high-k dielectric material, such as aluminum oxide. In some embodiments, a thickness of the first hydrogen blocking layer is between about 1 nm and about 100 nm, such as between 1 nm and 100 nm.

As illustrated in FIG. 5B, a hydrogen blocking layer 506 is formed above semiconductor layer 504. Hydrogen blocking layer 506 can be formed by depositing one or more layers of high-k dielectric materials, such as aluminum oxide, on semiconductor layer 504 using one or more thin film deposition process including, but not limited to, CVD, PVD, ALD, or any combination thereof. For example, hydrogen blocking layer 506 may be deposited using ALD to control the thickness of hydrogen blocking layer 506 between 1 nm and 100 nm. In some embodiments, hydrogen blocking layer 506 is deposited to cover semiconductor layer 504.

Method 600 proceeds to operation 620, as illustrated in FIG. 6, in which a contact extending vertically through the first hydrogen blocking layer and the semiconductor layer is formed. In some embodiments, a hydrogen blocking spacer is formed between the contact and the first hydrogen blocking layer.

Figure 5C:
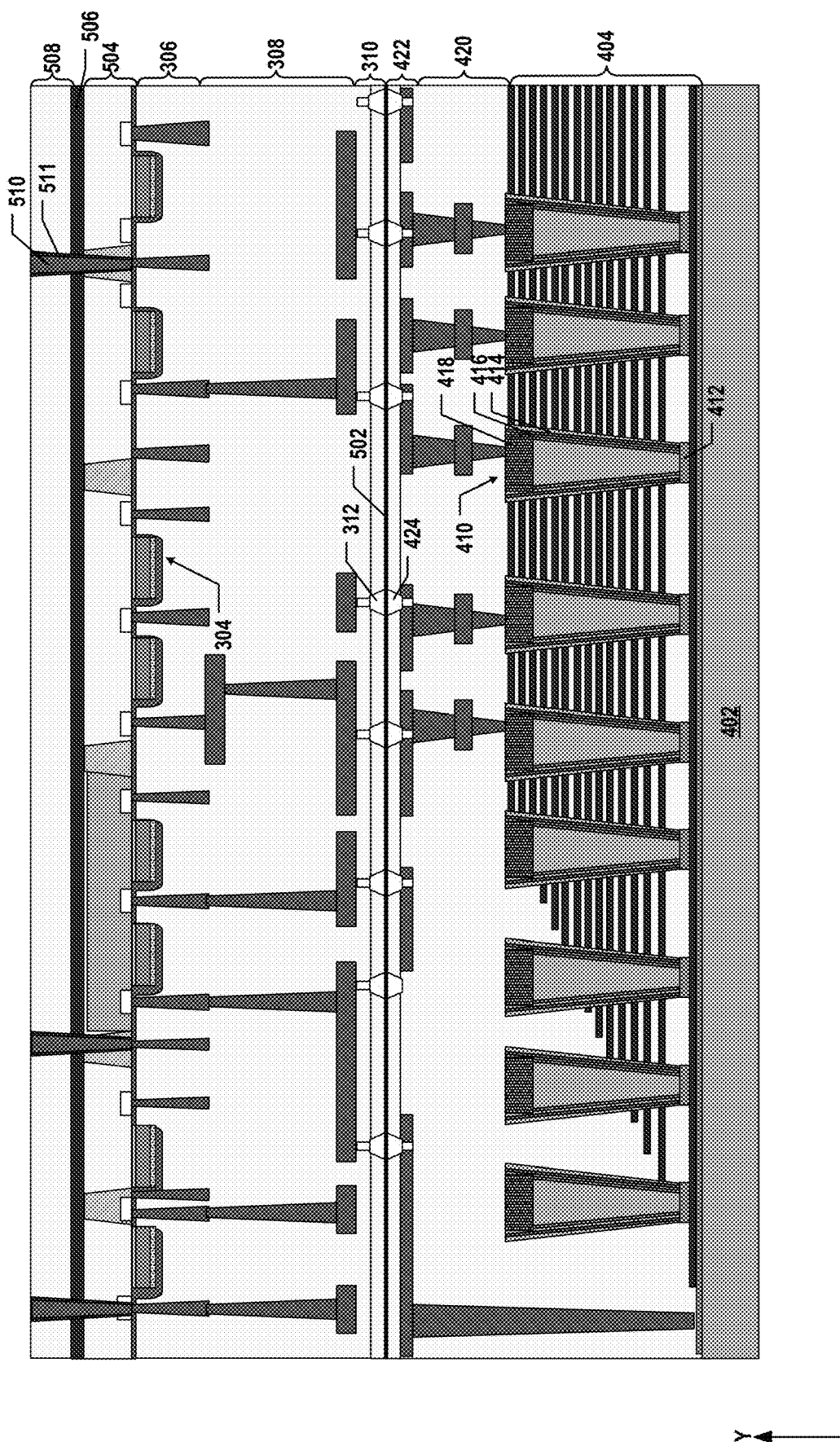

As illustrated in FIG. 5C, a dielectric layer 508, such as a layer of silicon oxide, can be deposited on hydrogen blocking layer 506 using one or more thin film deposition process including, but not limited to, CVD, PVD, ALD, or any combination thereof. Contacts 510 are formed extending vertically through dielectric layer 508, hydrogen blocking layer 506, and semiconductor layer 504 to be electrically connected to the interconnects in interconnect layer 308, according to some embodiments. Hydrogen blocking spacer 511 can be formed between each contact 510 and hydrogen blocking layer 506, for example, surrounding each contact 510. In some embodiments, contact holes are first etched through dielectric layer 508, hydrogen blocking layer 506, and semiconductor layer 504 using drying etching and/or wet etching processes, such as DRIE, followed by depositing hydrogen blocking spacer 511 (e.g., a layer of high-k dielectric materials) over the sidewalls of the contact holes using one or more thin film deposition process including, but not limited to, CVD, PVD, ALD, or any combination thereof. Contacts 510 then can be formed by depositing conductive materials, such as a metal, over hydrogen blocking spacer 511 to fill the contact holes using one or more thin film deposition process including, but not limited to, CVD, PVD, ALD, or any combination thereof.

Figure 5D:
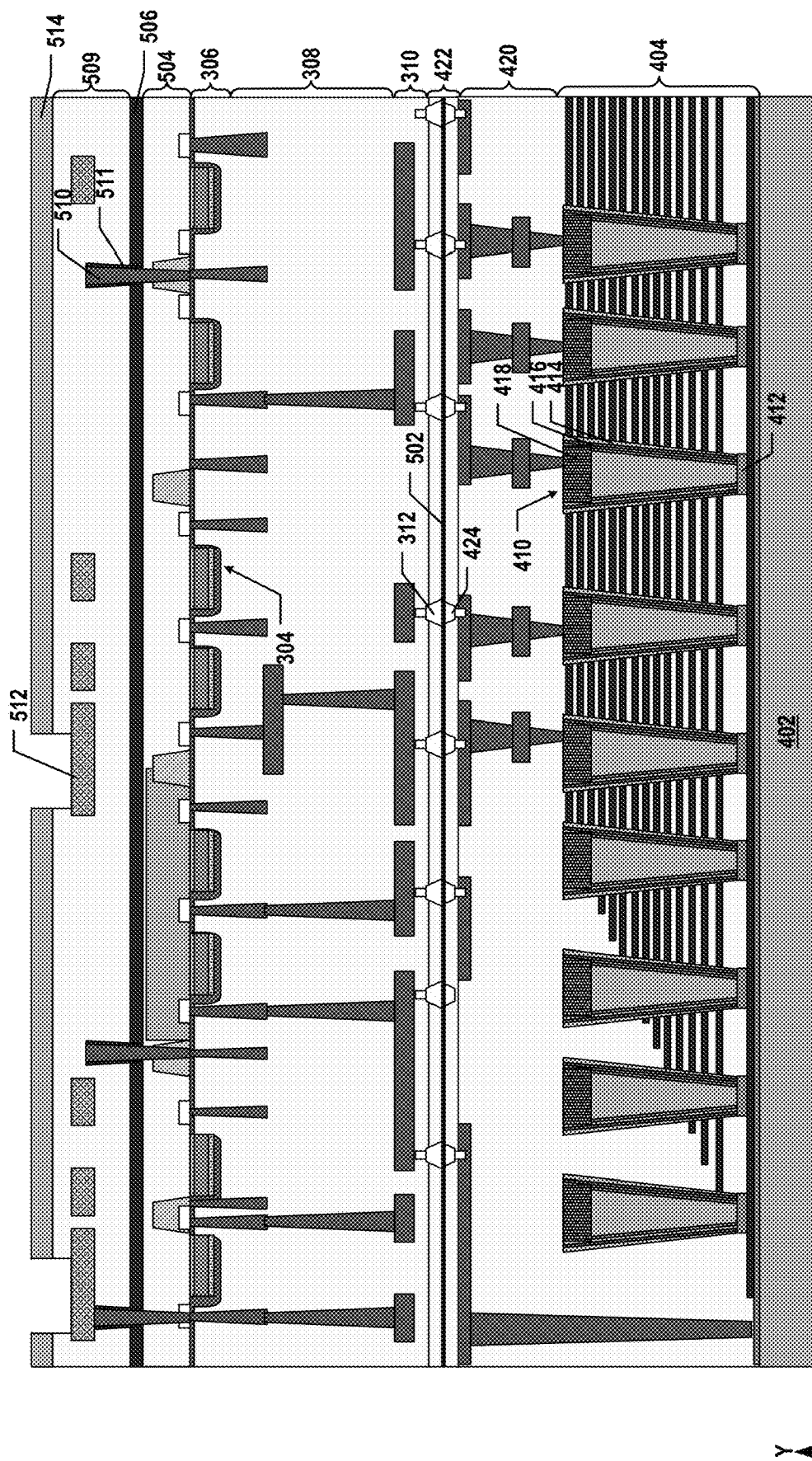

Method 600 proceeds to operation 622, as illustrated in FIG. 6, in which a pad-out interconnect layer is formed above the hydrogen blocking layer. As illustrated in FIG. 5D, a pad-out interconnect layer 509 is formed above hydrogen blocking layer 506. Pad-out interconnect layer 509 can include interconnects, such as pad contacts 512, formed in one or more ILD layers (e.g., dielectric layer 508 shown in FIG. 5C). Pad contacts 512 in pad-out interconnect layer 509 can be electrically connected to the interconnects in interconnect layer 308 through contacts 510. Pad contacts 512 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

Figure 7:
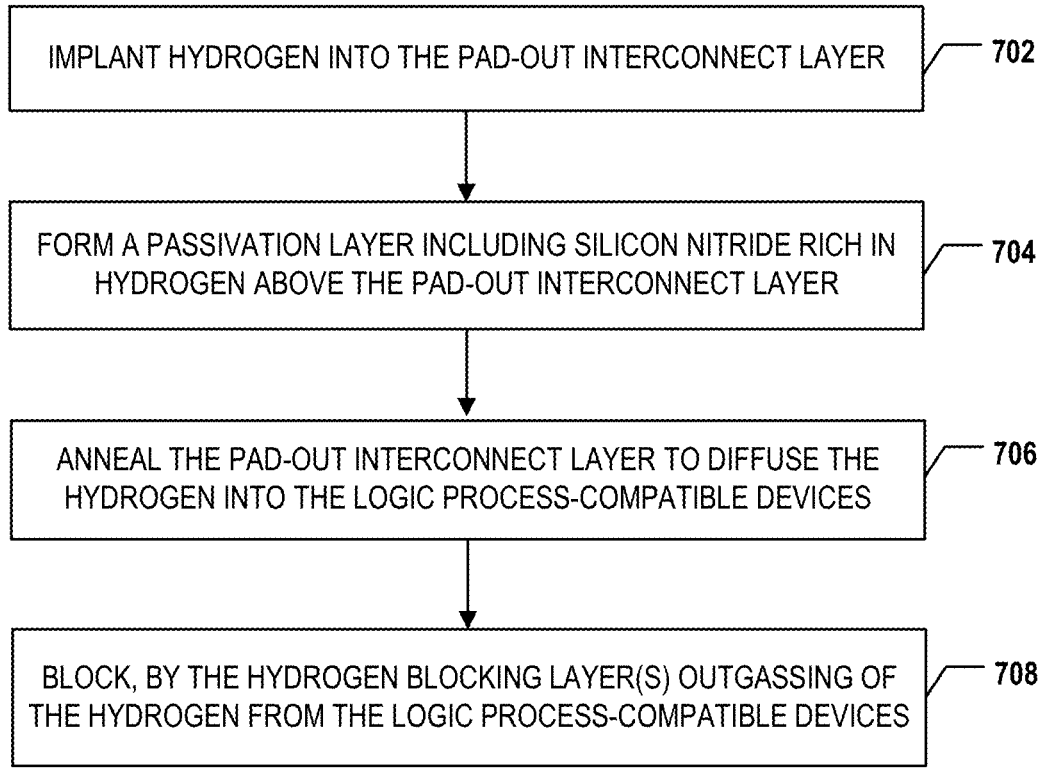
FIG. 7 is a flowchart of an exemplary method for blocking outgassing of hydrogen by a hydrogen blocking layer during the fabrication of a 3D memory device, according to some embodiments.

As part of the fabrication process for forming the pad-out interconnect layer, an anneal process is performed. However, anealing can cause hydrogen outgassing that releases hydrogen from the 3D memory device, thereby affecting the performance of the 3D memory device. FIG. 7 is a flowchart of an exemplary method 700 for blocking outgassing of hydrogen by a hydrogen blocking layer during the fabrication of a 3D memory device, according to some embodiments. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which hydrogen is implanted into the pad-out interconnect layer. As illustrated in FIG. 5D, after the formation of pad-out interconnect layer 509, an ion implantation process can be performed to implant hydrogen ions into pad-out interconnect layer 509.

Method 700 proceeds to operation 704, as illustrated in FIG. 7, in which a passivation layer is formed above the pad-out interconnect layer. The passivation layer can include silicon nitride rich in hydrogen. As illustrated in FIG. 5D, after hydrogen ion implantation, a passivation layer 514 can be formed on pad-out interconnect layer 509. In some embodiments, passivation layer 514 is formed by depositing one or more dielectric layers, such as a silicon oxide layer and a silicon nitride layer that is rich in hydrogen, on pad-out interconnect layer 509 using one or more thin film deposition process including, but not limited to, CVD, PVD, ALD, or any combination thereof. In some embodiments, pad contact openings are etched through passivation layer 514 to expose pad contacts 512 underneath using drying etching and/or wet etching processes.

Operations 702 and 704 may be implemented to supply extrinsic hydrogen into the 3D memory devices for breaking dangling bonds in device layer 306. It is understood that in some cases, the intrinsic hydrogen existing in the 3D memory devices, for example, from prior fabrication processes, may be sufficient. As a result, one or both of operations 702 and 704 may be skipped or modified. In one example, the hydrogen ion implantation in operation 702 may be skipped. In another example, the passivation layer formed in operation 704 may include regular silicon nitride instead of silicon nitride rich in hydrogen.

Method 700 proceeds to operation 706, as illustrated in FIG. 7, in which the pad-out interconnect layer is annealed to diffuse hydrogen into the logic process-compatible devices. As illustrated in FIG. 5D, an annealing process, such as the rapid thermal anneal (RTA), can be performed to pad-out interconnect layer 509 to diffuse the hydrogen (intrinsic hydrogen and/or extrinsic hydrogen from operations 702 and 704) into device layer 306 having the logic process-compatible devices.

Method 700 proceeds to operation 708, as illustrated in FIG. 7, in which outgassing of the hydrogen from the logic process-compatible devices is blocked by the hydrogen blocking layer(s). As illustrated in FIG. 5D, the outgassing of the hydrogen (intrinsic hydrogen and/or extrinsic hydrogen from operations 702 and 704), for example, trigger or intensified by the annealing process, from device layer 306 having the logic process-compatible devices can be blocked by hydrogen blocking layer 506 (and hydrogen blocking spacers 511 if any). It is understood that in some embodiments, another hydrogen blocking layer (not shown) between device layer 306 and bonding layer 310 may further block the outgassing of the hydrogen, for example, toward bonding interface 502.

According to one aspect of the present disclosure, a 3D memory device includes a substrate, a memory stack including interleaved conductive layers and dielectric layers above the substrate, an array of NAND memory strings each extending vertically through the memory stack, a plurality of logic process-compatible devices above the array of NAND memory strings, a semiconductor layer above and in contact with the logic process-compatible devices, a pad-out interconnect layer above the semiconductor layer, and a hydrogen blocking layer vertically between the semiconductor layer and the pad-out interconnect layer. The hydrogen blocking layer is configured to block outgassing of hydrogen.

In some embodiments, the hydrogen blocking layer includes a high-k dielectric material. In some embodiments, the high-k dielectric material includes aluminum oxide.

In some embodiments, a thickness of the hydrogen blocking layer is between about 1 nm and about 100 nm.

In some embodiments, the hydrogen blocking layer extends laterally to cover the semiconductor layer.

In some embodiments, the hydrogen blocking layer is configured to block outgassing of the hydrogen from the logic process-compatible devices into or beyond the pad-out interconnect layer during fabrication of the 3D memory device.

In some embodiments, the 3D memory device further includes a first bonding layer above the array of NAND memory strings and including a plurality of first bonding contacts, a second bonding layer below the logic process-compatible devices and above the first bonding layer and including a plurality of second bonding contacts, and a bonding interface vertically between the first bonding layer and the second bonding layer. The first bonding contacts can be in contact with the second bonding contacts at the bonding interface.

In some embodiments, the 3D memory device further includes a first interconnect layer vertically between the array of NAND memory strings and the first bonding layer, and a second interconnect layer vertically between the second bonding layer and the logic process-compatible devices. The logic process-compatible devices can be electrically connected to the array of NAND memory strings through the first and second interconnect layers and the first and second bonding contacts.

In some embodiments, the 3D memory device further includes a contact extending vertically through the hydrogen blocking layer and the semiconductor layer to electrically connect the pad-out interconnect layer and the second interconnect layer. In some embodiments, the 3D memory device further includes a hydrogen blocking spacer between the contact and the hydrogen blocking layer.

In some embodiments, the semiconductor layer includes single crystalline silicon.

In some embodiments, the 3D memory device further includes a passivation layer above the pad-out interconnect layer. In some embodiments, the passivation layer includes silicon nitride.

According to another aspect of the present disclosure, a 3D memory device includes a substrate, a first hydrogen blocking layer above the substrate, a plurality of logic process-compatible devices above the first hydrogen blocking layer, a semiconductor layer above and in contact with the logic process-compatible devices, a second hydrogen blocking layer above the semiconductor layer, and a pad-out interconnect layer above the second hydrogen blocking layer. The first hydrogen blocking layer and the second hydrogen blocking layer are configured to block outgassing of hydrogen from the logic process-compatible devices during fabrication of the 3D memory device.

In some embodiments, each of the first and second hydrogen blocking layers includes a high-k dielectric material. In some embodiments, the high-k dielectric material includes aluminum oxide.

In some embodiments, a thickness of each of the first and second hydrogen blocking layers is between about 1 nm and about 100 nm.

In some embodiments, the first and second hydrogen blocking layers extend laterally to encapsulate the logic process-compatible devices in a vertical direction.

In some embodiments, the 3D memory device further includes a first bonding layer above the substrate and including a plurality of first bonding contacts, a second bonding layer below the logic process-compatible devices and above the first bonding layer and including a plurality of second bonding contacts, and a bonding interface vertically between the first bonding layer and the second bonding layer and at which the first bonding contacts are in contact with the second bonding contacts. In some embodiments, the first hydrogen blocking layer is vertically between the second bonding layer and the logic process-compatible devices.

In some embodiments, the 3D memory device further includes a contact extending vertically through the second hydrogen blocking layer and the semiconductor layer. In some embodiments, the 3D memory device further includes a hydrogen blocking spacer between the contact and the second hydrogen blocking layer.

In some embodiments, the semiconductor layer includes single crystalline silicon.

In some embodiments, the 3D memory device further includes a passivation layer above the pad-out interconnect layer. In some embodiments, the passivation layer includes silicon nitride.

According to still another aspect of the present disclosure, a method for form a 3D memory device is disclosed. An array of NAND memory strings each extending vertically above a first substrate are formed. A plurality of logic process-compatible devices are formed on a second substrate. The first substrate and the second substrate are bonded in a face-to-face manner. The logic process-compatible devices are above the array of NAND memory strings after the bonding. The second substrate is thinned to form a semiconductor layer above and in contact with the logic process-compatible devices.

In some embodiments, a pad-out interconnect layer is formed above the first hydrogen blocking layer, and the pad-out interconnect layer is annealed to diffuse hydrogen into the logic process-compatible devices. The first hydrogen blocking layer can block outgassing of the hydrogen from the logic process-compatible devices into or beyond the pad-out interconnect layer after the annealing.

In some embodiments, prior to the annealing, a passivation layer is formed above the pad-out interconnect layer. The passivation layer can include silicon nitride rich in hydrogen.

In some embodiments, prior to the annealing, hydrogen is implanted into the pad-out interconnect layer.

In some embodiments, prior to forming the pad-out interconnect layer, a contact extending vertically through the first hydrogen blocking layer and the semiconductor layer is formed to be electrically connected to the pad-out interconnect layer. In some embodiments, a hydrogen blocking spacer is formed between the contact and the first hydrogen blocking layer.

In some embodiments, a second hydrogen blocking layer is formed above the logic process-compatible devices on the second substrate. The second hydrogen blocking layer can include a high-k dielectric material and block outgassing of the hydrogen from the logic process-compatible devices after the annealing.

In some embodiments, a first interconnect layer is formed above the array of NAND memory strings above the first substrate, a first bonding layer is formed above the first interconnect layer including a plurality of first bonding contacts, a second interconnect layer is formed above the logic process-compatible devices on the second substrate, and a second bonding layer is formed above the second interconnect layer and including a plurality of second bonding contacts.

In some embodiments, the bonding includes hybrid bonding of the first bonding layer and the second bonding layer, such that the first bonding contacts are in contact with the second bonding contacts at a bonding interface.

In some embodiments, the high-k dielectric material of the first hydrogen blocking layer includes aluminum oxide.

In some embodiments, a thickness of the first hydrogen blocking layer is between about 1 nm and about 100 nm.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate;
a memory stack comprising interleaved conductive layers and dielectric layers above the substrate;
an array of NAND memory strings each extending vertically through the memory stack;
a plurality of logic process-compatible devices above the array of NAND memory strings;
a semiconductor layer above and in contact with the logic process-compatible devices;
a pad-out interconnect layer above the semiconductor layer; and
a hydrogen blocking layer vertically between the semiconductor layer and the pad-out interconnect layer, wherein the hydrogen blocking layer is configured to block outgassing of hydrogen, and the semiconductor layer is vertically between the plurality of logic process-compatible devices and the hydrogen blocking layer.

2. The 3D memory device of claim 1, wherein the hydrogen blocking layer comprises a high dielectric constant (high-k) dielectric material.

3. The 3D memory device of claim 1, wherein a thickness of the hydrogen blocking layer is between about 1 nm and about 100 nm.

4. The 3D memory device of claim 1, wherein the hydrogen blocking layer extends laterally to cover the semiconductor layer.

5. The 3D memory device of claim 1, wherein the hydrogen blocking layer is configured to block outgassing of the hydrogen from the logic process-compatible devices into or beyond the pad-out interconnect layer during fabrication of the 3D memory device.

6. The 3D memory device of claim 1, further comprising:
a first bonding layer above the array of NAND memory strings and comprising a plurality of first bonding contacts;
a second bonding layer below the logic process-compatible devices and above the first bonding layer and comprising a plurality of second bonding contacts; and
a bonding interface vertically between the first bonding layer and the second bonding layer, wherein the first bonding contacts are in contact with the second bonding contacts at the bonding interface.

7. The 3D memory device of claim 6, further comprising:
a first interconnect layer vertically between the array of NAND memory strings and the first bonding layer; and
a second interconnect layer vertically between the second bonding layer and the logic process-compatible devices,
wherein the logic process-compatible devices are electrically connected to the array of NAND memory strings through the first and second interconnect layers and the first and second bonding contacts.

8. The 3D memory device of claim 7, further comprising:
a contact extending vertically through the hydrogen blocking layer and the semiconductor layer to electrically connect the pad-out interconnect layer and the second interconnect layer; and
a hydrogen blocking spacer between the contact and the hydrogen blocking layer.

9. The 3D memory device of claim 1, further comprising a passivation layer above the pad-out interconnect layer.

10. The 3D memory device of claim 1, wherein the semiconductor layer comprises single crystalline silicon.

11. A three-dimensional (3D) memory device, comprising:
a substrate;
a first hydrogen blocking layer above the substrate;
a plurality of logic process-compatible devices above the first hydrogen blocking layer;
a semiconductor layer above and in contact with the logic process-compatible devices;
a second hydrogen blocking layer above the semiconductor layer, the semiconductor layer being vertically between the plurality of logic process-compatible devices and the second hydrogen blocking layer; and
a pad-out interconnect layer above the second hydrogen blocking layer,
wherein the first hydrogen blocking layer and the second hydrogen blocking layer are configured to block outgassing of hydrogen from the logic process-compatible devices during fabrication of the 3D memory device.

12. The 3D memory device of claim 11, wherein each of the first and second hydrogen blocking layers comprises a high dielectric constant (high-k) dielectric material.

13. The 3D memory device of claim 11, wherein the first and second hydrogen blocking layers extend laterally to encapsulate the logic process-compatible devices in a vertical direction.

14. The 3D memory device of claim 11, wherein a thickness of each of the first and second hydrogen blocking layers is between about 1 nm and about 100 nm.

15. The 3D memory device of claim 11, further comprising:
a first bonding layer above the substrate and comprising a plurality of first bonding contacts;
a second bonding layer below the logic process-compatible devices and above the first bonding layer and comprising a plurality of second bonding contacts; and
a bonding interface vertically between the first bonding layer and the second bonding layer, wherein the first bonding contacts are in contact with the second bonding contacts at the bonding interface.

16. The 3D memory device of claim 15, wherein the first hydrogen blocking layer is vertically between the second bonding layer and the logic process-compatible devices.

17. The 3D memory device of claim 15, further comprising a contact extending vertically through the second hydrogen blocking layer and the semiconductor layer.

18. The 3D memory device of claim 17, further comprising a hydrogen blocking spacer between the contact and the second hydrogen blocking layer.

19. The 3D memory device of claim 11, wherein the semiconductor layer comprises single crystalline silicon.

20. The 3D memory device of claim 11, further comprising a passivation layer above the pad-out interconnect layer.

* * * * *